(12) United States Patent
Matsumoto

(10) Patent No.: US 6,304,318 B1
(45) Date of Patent: Oct. 16, 2001

(54) LITHOGRAPHY SYSTEM AND METHOD OF MANUFACTURING DEVICES USING THE LITHOGRAPHY SYSTEM

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/340,132

(22) Filed: Jun. 28, 1999

(30) Foreign Application Priority Data

Jun. 30, 1998 (JP) .................................................. 10-184042

(51) Int. Cl.[7] ............................. G03B 27/52; G03B 27/42
(52) U.S. Cl. .............................. 355/55; 355/53; 356/450; 356/485; 356/488
(58) Field of Search ........................... 355/53, 55, 67; 356/49 C, 50 S, 450, 499, 401, 488, 485; 250/548; 430/4, 5, 321; 359/577

(56) References Cited

U.S. PATENT DOCUMENTS

| | | | |
|---|---|---|---|
| Re. 34,010 | * 7/1992 | Magome et al. | 356/488 |
| 4,826,291 | * 5/1989 | Utaka et al. | 430/5 |
| 4,997,747 | * 3/1991 | Yoshida et al. | 430/321 |
| 5,000,573 | * 3/1991 | Suzuki et al. | 356/490 |
| 5,142,156 | * 8/1992 | Ozawa et al. | 250/548 |
| 5,171,999 | * 12/1992 | Komatsu et al. | 250/548 |
| 5,238,785 | * 8/1993 | Ohkura et al. | 430/321 |
| 5,386,433 | * 1/1995 | Ohkura et al. | 372/96 |
| 5,432,603 | 7/1995 | Sentoku et al. | 356/490 |
| 5,579,111 | * 11/1996 | Maeda | 356/499 |
| 5,610,718 | 3/1997 | Sentoku et al. | 356/490 |
| 5,734,478 | * 3/1998 | Magome et al. | 356/401 |
| 5,751,426 | 5/1998 | Nose et al. | 356/505 |
| 5,906,901 | * 5/1999 | Tanimoto | 430/22 |

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

A lithography system for exposing a photosensitive member includes a photosensitive member placement unit, and an interference optical system. The interference optical system produces interference fringes on the photosensitive member so that the interference fringes will be transferred to the photosensitive member. The interference fringes are aligned based on detected light that has passed through the interference optical system.

20 Claims, 13 Drawing Sheets

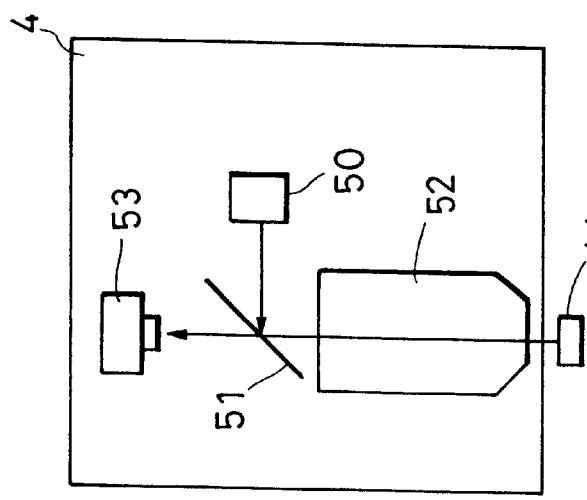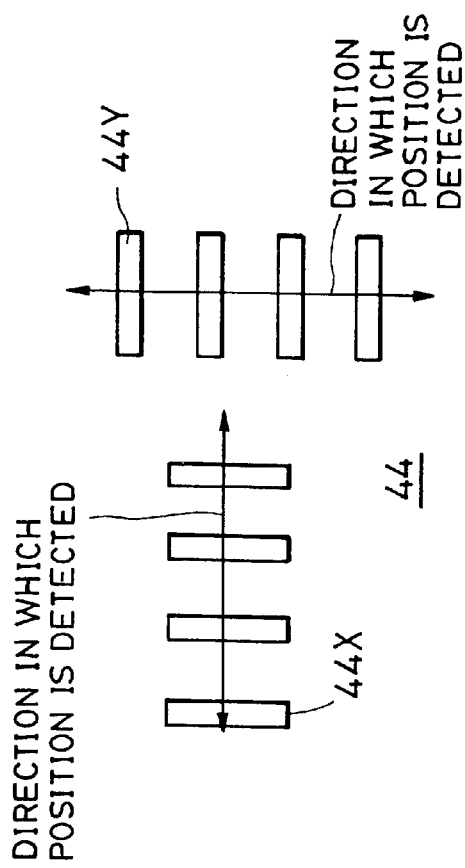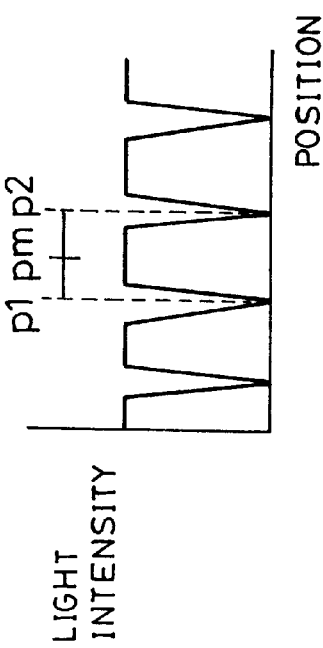

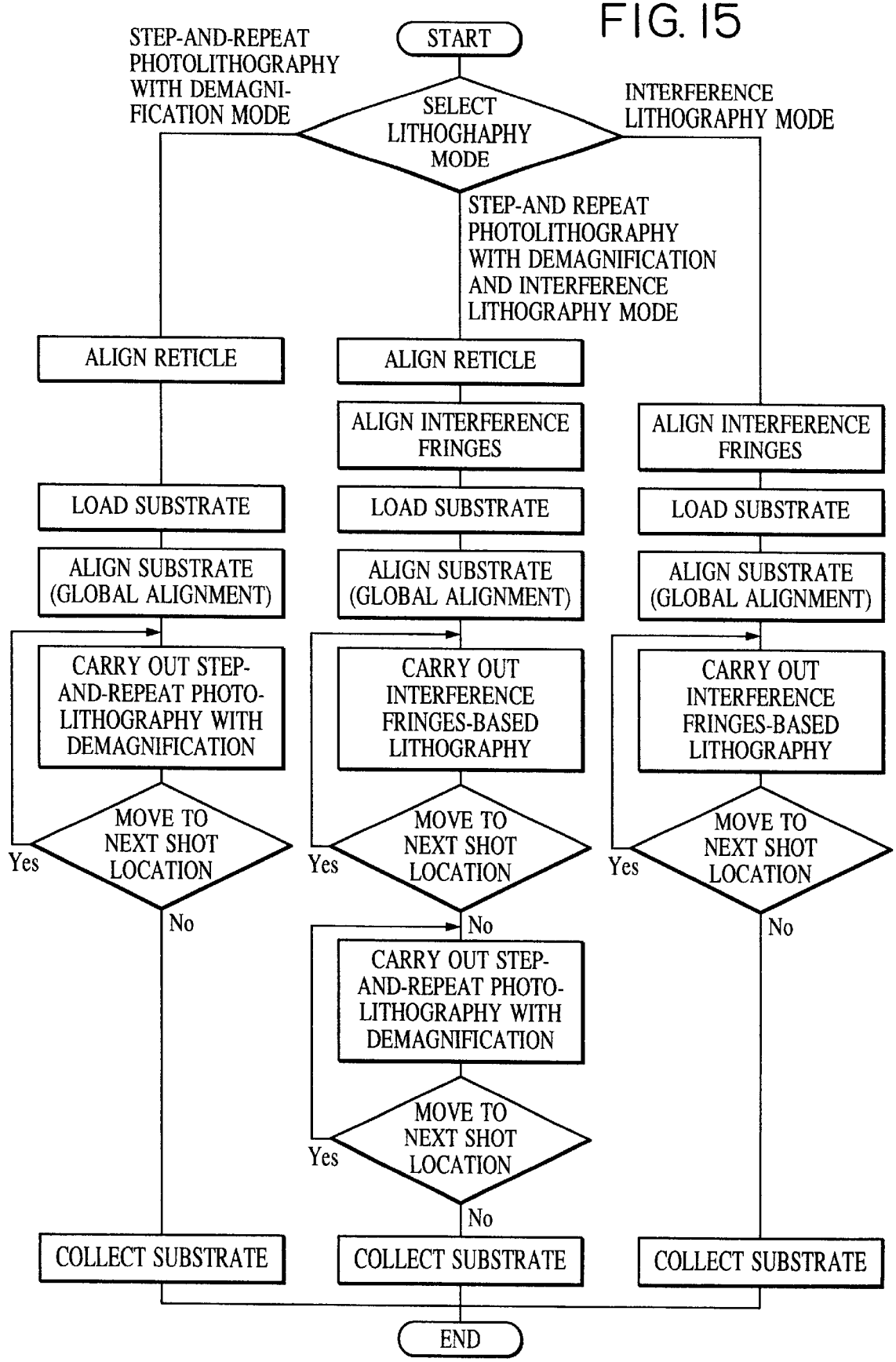

FIG. 17A DISTRIBUTION OF EXPOSURES ON SECTION TT
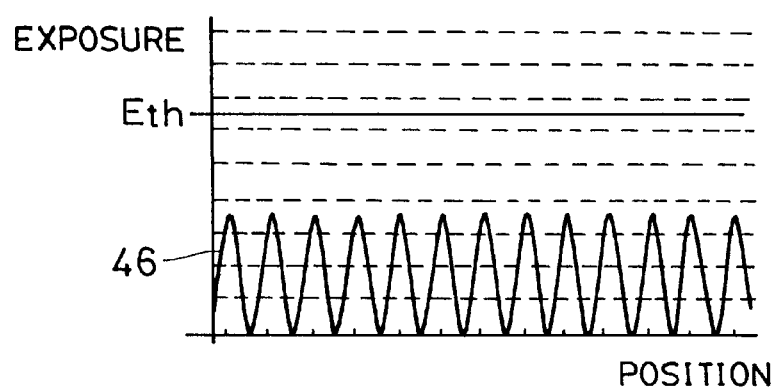
FIG. 17B DISTRIBUTION OF EXPOSURES ON SECTION TT
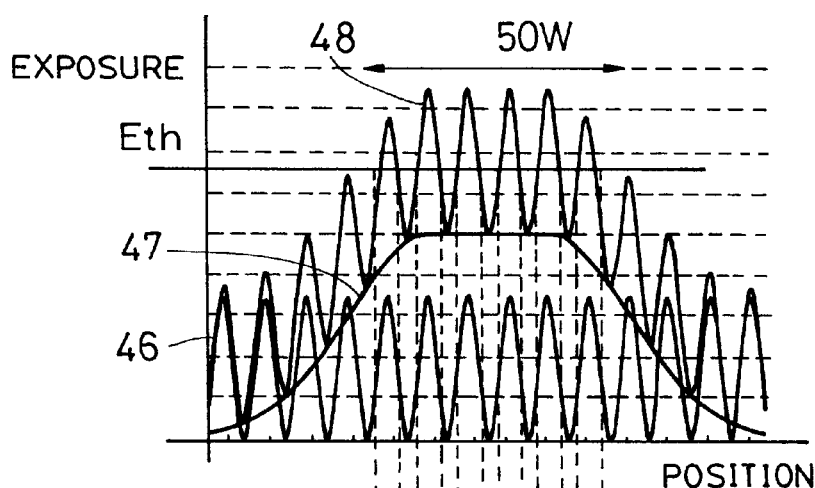
FIG. 17C
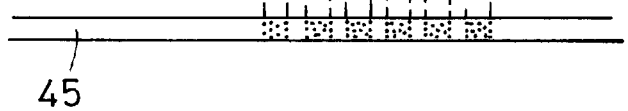
FIG. 17D
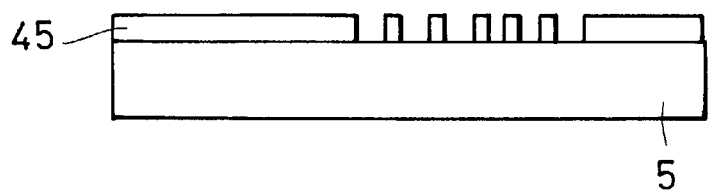

LITHOGRAPHY SYSTEM AND METHOD OF MANUFACTURING DEVICES USING THE LITHOGRAPHY SYSTEM

BACKGROUND OF THE INVENTION

1. Field of the Invention

The present invention relates to a lithography system and a method of manufacturing devices using the lithography system. The lithography system and method of manufacturing devices using the lithography system are successfully adaptable to a method and system for manufacturing microscopic lines and spaces, or more particularly, to a method and system for manufacturing semiconductor devices using a diffraction grating. The semiconductor devices include optical devices, a semiconductor laser, and devices to be integrated into a semiconductor integrated circuit.

2. Description of the Related Art

According to a first method of forming a pattern of lines and spaces that has been adopted in the past, two-beam interference fringes are, as shown in FIG. 1, produced on a substrate to which a photosensitive agent is applied. The substrate is developed after being exposed. A pattern of lines and spaces is formed using the photosensitive agent. The substrate is then etched, while being masked with the pattern of lines and spaces formed with the photosensitive agent. The pattern of lines and spaces is thus drawn on the substrate.

Referring to FIG. 1, light emanating from a coherent light source such as a laser is bifurcated by a beam splitter 101, reflected by mirrors 102 and 103, and crossed on a substrate 104. At this time, interference fringes, or in other words, a pattern of lines and spaces is formed in a two-beam crossing area 105. Assuming that an angle of incidence of the light beams is θ and a wavelength provided by the coherent light source is λ, the pitch P between adjoining lines and spaces of the pattern is expressed as follows:

$$P=\lambda/(2 \sin \theta)$$

For example, when a He—Cd laser providing a wavelength of λ=325 nm is used as the coherent light source, and the angle of incidence θ is 60°, a pattern of lines and spaces having a pitch P=0.188 um (0.1 um or less between adjoining lines) can be drawn.

The foregoing two-beam interference fringes-based lithography method has the features described below. One of the features lies in that the cost of manufacturing is lower than that required by step-and-repeat photolithography method with demagnification. According to the step-and-repeat photolithography method with demagnification, a pattern is drawn on a mask using an electron-beam plotter and then projected on a substrate using a step-and-repeat photolithography system with demagnification. Another feature lies in that it is easier to draw a pattern with a pitch between adjoining lines and spaces set at 0.15 um or less than it is according to the step-and-repeat photolithography method with demagnification. The step-and-repeat photolithography method with demagnification adopts an excimer laser, which is currently a mainstream laser, as a light source. Another feature is a higher resolution than that offered by the step-and-repeat photolithography method with demagnification.

However, for example, a semiconductor device can be produced by overlaying numerous layers of patterns of circuits on a substrate (wafer). For exposing the wafer in order to form patterns of circuits of the second and subsequent layers, each pattern of the circuits to be formed must be highly precisely aligned with each shot location on the wafer. At each shot location, a pattern of circuits has already been formed. No practical method of directly controlling a location to be exposed to interference fringes has been implemented in existing interference fringes-based lithography systems. The interference fringes-based lithography systems must be further innovated so that they can be used to manufacture devices to be integrated into a semiconductor integrated circuit. For manufacturing the devices, patterns of circuits must be overlaid successively.

SUMMARY OF THE INVENTION

An object of the present invention is to provide a lithography system capable of accurately exposing a desired location on a substrate (wafer) to desired interference fringes, and a method of manufacturing devices using the lithography system.

In a first aspect, the present invention provides a lithography system for exposing a photosensitive member. The system includes a photosensitive member placement unit and an interference optical system producing interference fringes on the photosensitive member so that the interference fringes will be transferred to the photosensitive member. The interference fringes are aligned based on detected light having passed through the interference optical system.

In another aspect, the present invention provides a lithography system for exposing a substrate to interference fringes. The system includes interference fringes producing means, interference fringes control means for controlling the interference fringes produced by the interference fringes producing means, position-of-interference fringes detecting means for detecting positional information of the interference fringes, position-of-substrate detecting means for detecting positional information of the substrate, and a substrate stage. The interference fringes are positioned by the interference fringes control means, based on the positional information of the interference fringes, which is detected by the position-of-interference fringes detecting means, the substrate is positioned based on the positional information of the substrate detected by the position-of-substrate detecting means, and the interference fringes are thus positioned in a predetermined place on the substrate.

In yet another aspect, the present invention provides a lithography system for projecting a pattern drawn on a reticle onto a substrate. The system includes interference fringes producing means, interference fringes control means for controlling interference fringes produced by the interference fringes producing means, position-of-interference fringes detecting means for detecting positional information of the interference fringes, position-of-substrate detecting means for detecting positional information of the substrate, reticle holding means for holding a reticle, reticle alignment means, a step-and-repeat photolithography unit with demagnification, illuminating means for illuminating the reticle held by the reticle holding means so that a pattern drawn on the reticle will be demagnified and projected onto the substrate by the step-and-repeat photolithography unit with demagnification, and a substrate stage for holding the substrate. The interference fringes are positioned by the interference fringes control means, based on positional information of the interference fringes, which is detected by the position-of-interference fringes detecting means, the reticle alignment means aligns the reticle with the step-and-repeat photolithography unit with demagnification, the substrate is positioned relative to the interference fringes according to positional information of the substrate detected by the position-of-substrate detecting means, and exposed to the interference fringes, the substrate is positioned in the step-and-repeat photolithography unit with demagnification according to positional information of the substrate detected by the position-of-substrate detecting means, and then a pattern drawn on the reticle is projected onto the substrate.

In still another aspect, the present invention provides a method of manufacturing devices includes the steps of aligning interference fringes according to detected light that has passed through an interference fringes production interference optical system, producing interference fringes on a photosensitive member using the interference optical system so that the interference fringes will be transferred to the photosensitive member, and forming circuits according to a pattern drawn on the photosensitive member by transferring the interference fringes.

In still another aspect, the present invention provides a method of manufacturing devices including the steps of exposing a substrate using a lithography system, the lithography system including interference fringes producing means, interference fringes control means for controlling interference fringes produced by the interference fringes producing means, position-of-interference fringes detecting means for detecting positional information of the interference fringes, position-of-substrate detecting means for detecting positional information of a substrate, and a substrate stage for holding a substrate, positioning the interference fringes by the interference fringes control means, based on positional information of the interference fringes, which is detected by the position-of-interference fringes detecting means, positioning the substrate based on positional information of the substrate detected by the position-of-substrate detecting means, thereafter, positioning the interference fringes in a predetermined place on the substrate, and forming circuits according to a pattern drawn on the substrate by exposing the substrate, to manufacture devices.

In still another aspect, the present invention provides a method of manufacturing devices, including the steps of exposing a substrate using a lithography system, the lithography system including interference fringes producing means, interference fringes control means for controlling interference fringes produced by the interference fringes producing means, position-of-interference fringes detecting means for detecting positional information of the interference fringes, position-of-substrate detecting means for detecting positional information of the substrate, reticle holding means for holding a reticle, reticle alignment means, a step-and-repeat photolithography unit with demagnification, illuminating means for illuminating a reticle held by the reticle holding means so that a pattern drawn on the reticle will be demagnified and projected onto the substrate by the step-and-repeat photolithography unit with demagnification, and a substrate stage for holding a substrate, positioning the interference fringes by the interference fringes control means, based on positional information of the interference fringes, which is detected by the position-of-interference fringes detecting means, aligning the reticle with the step-and-repeat photolithography unit with demagnification by the reticle alignment means, positioning the substrate relative to the interference fringes according to positional information of the substrate detected by the position-of-substrate detecting means, and exposed to the interference fringes, positioning the substrate in the step-and-repeat photolithography unit with demagnification according to positional information of the substrate detected by the position-of-substrate detecting means, thereafter, projecting a pattern drawn on the reticle onto the substrate, and forming circuits according to the pattern drawn on the substrate by exposing the substrate, to manufacture a device.

Other objects of the present invention will be apparent from the subsequent description of the embodiments.

BRIEF DESCRIPTION OF THE DRAWINGS

FIG. 11A to FIG. 11D are diagrams for explaining the principles of detecting alignment in the first embodiment;

FIG. 15 describes an exposure sequence implemented in the second embodiment;

FIG. 17A to FIG. 17D are diagrams for explaining the principles of multi-lithography employed in the second embodiment.

DESCRIPTION OF THE PREFERRED EMBODIMENTS

Embodiments of the present invention will be described below in conjunction with the drawings.

Figure 1:
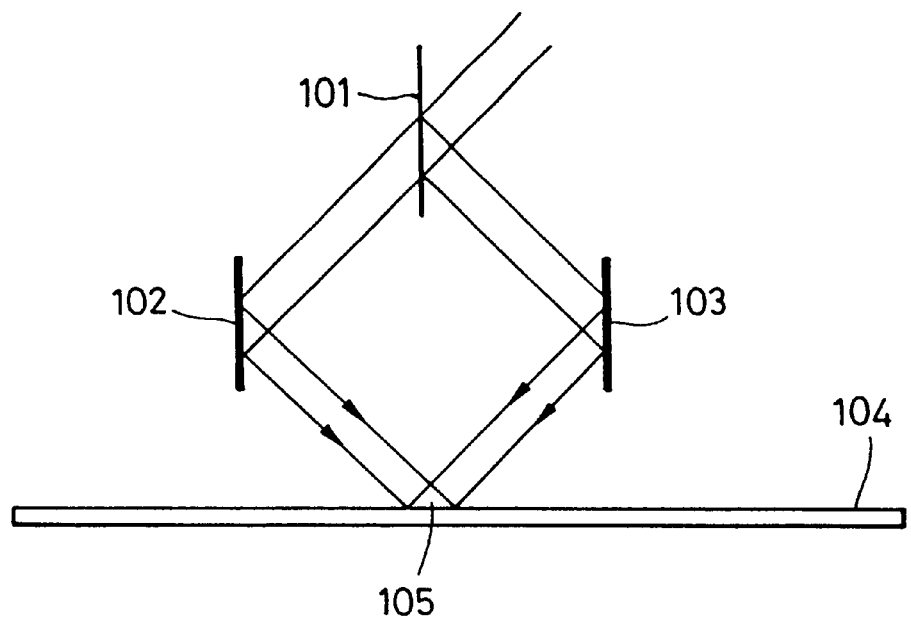
FIG. 1 is a diagram for explaining a related art.
Figure 2:
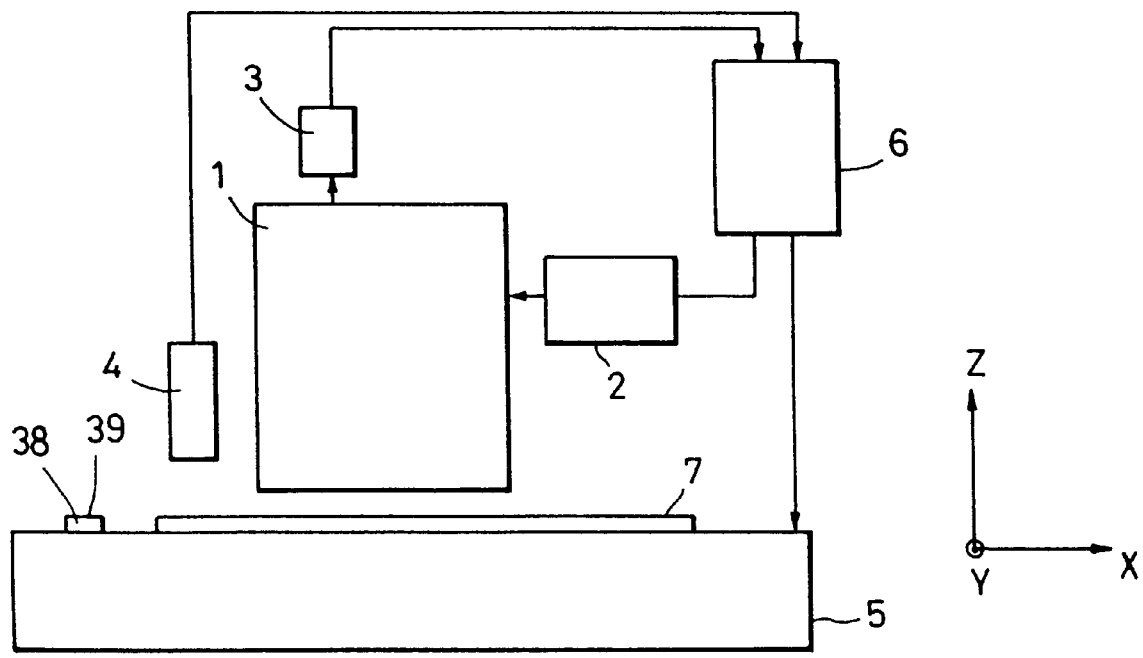
FIG. 2 is an illustrative diagram of an interference fringes-based lithography system in accordance with a first embodiment of the present invention.

FIG. 2 is a block diagram showing the concepts of a semiconductor lithography system in accordance with the first embodiment of the present invention. In FIG. 2, there are shown an interference fringes producing means 1, a position-of-interference fringes control means 2, a position-of-interference fringes detecting means 3, a position-of-substrate detecting means 4, a substrate stage 5, a central processing control means 6, a semiconductor substrate (wafer) 7, and a reference mark base 38. The reference mark base 38 is employed by the position-of-interference fringes detecting means.

In this system, the position of interference fringes produced by the interference fringes producing means 1 is measured by the position-of-interference fringes detecting means 3. The magnitude of a positional deviation is reported to the central processing control means 6. The position of the substrate 7 is measured by the position-of-substrate detecting means 4. The magnitude of a positional deviation of the substrate is reported to the central processing means 6. The central processing control means issues a command value based on the magnitude of the positional deviation of the interference fringes and the magnitude of the positional deviation of the substrate. The command value is sent to the position-of-interference fringes control means 2 and substrate stage 5. The interference fringes produced by the interference fringes producing means 1 are aligned with the substrate 7, whereby the substrate is exposed to the interference fringes.

The detailed configurations of the means included in this embodiment will be described below.

Figure 3:
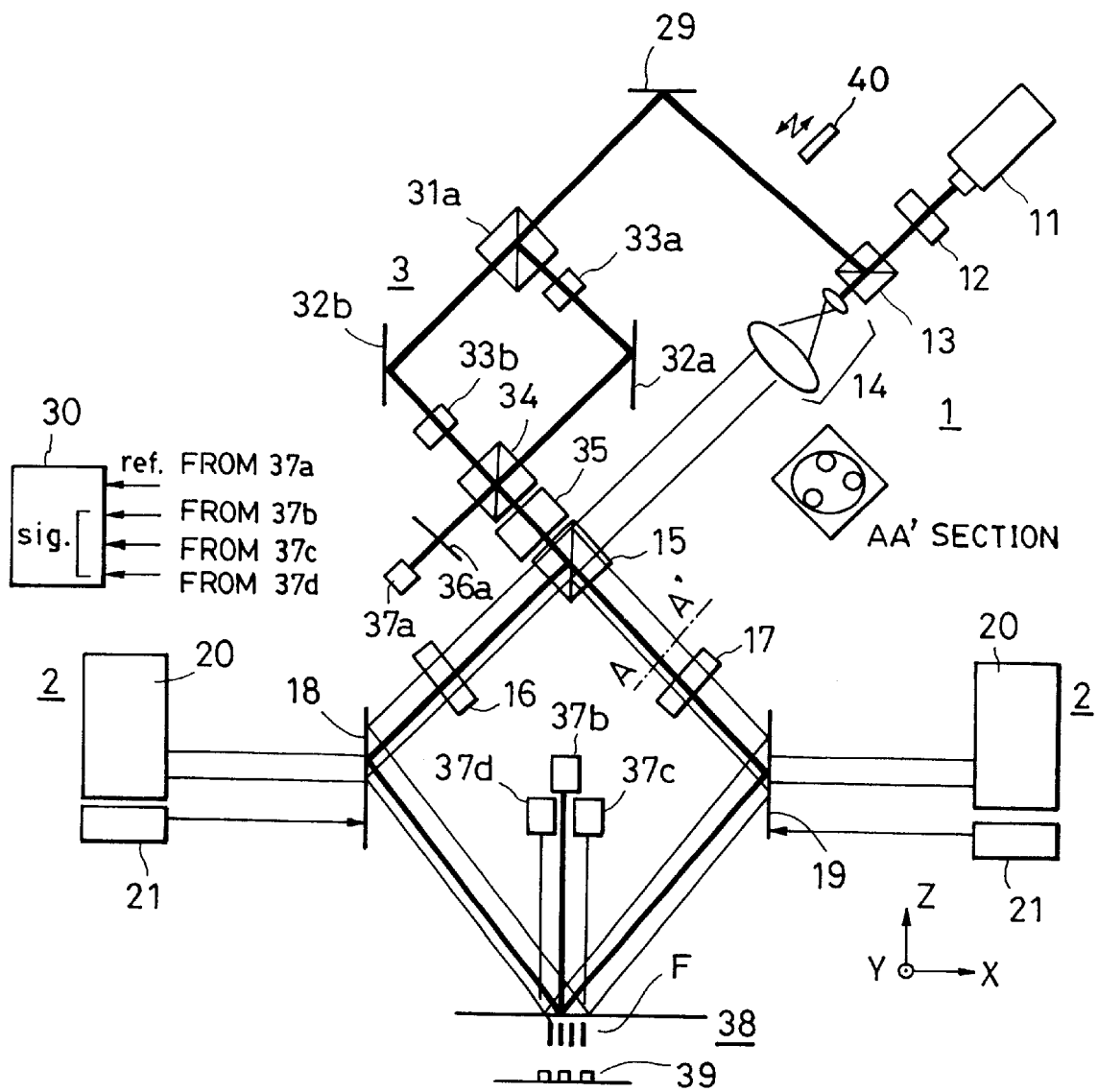
FIG. 3 is a diagram for explaining an interference fringes producing means, an interference fringes control means, and a position-of-interference fringes detecting means in the first embodiment.

FIG. 3 is an exemplary explanatory diagram of a major portion of the lithography system shown in the block diagram of FIG. 2.

The interference fringes producing means 1 comprises, as shown in FIG. 3, a coherent light source 11, a crystal polarizer 12, a beam splitter 13, a beam expander 14, a polarization beam splitter 15, a half-wave plate ($\lambda/2$ plate) 16, an optical length compensator 17, a mirror 18, and a mirror 19.

In this embodiment, an argon laser (beam radius: 1 mm) offering a wavelength of 496 nm is used as the coherent light source 11. A beam emanating from the coherent light source 11 is recomposed into linearly polarized light. The linearly polarized light travels at an angle of 45° with respect to the direction of p-polarized light (s-polarized light) produced by the polarization beam splitter 15 to be described later. The linearly polarized light is transmitted by the beam splitter 13. The light transmitted by the beam splitter 13 falls on the beam expander 14, whereby the light is magnified twenty times larger to provide a beam radius of 20 mm. The magnification to be offered by the beam expander should be determined in terms of an effective area of exposure, and the size of a beam emanating from a coherent light source employed.

The beam magnified by the beam expander 14 is split by the polarization beam splitter 15. Transmitted p-polarized light is converted into s-polarized light by the half-wave plate 16, and then deflected by the mirror 18. The other s-polarized light reflected from the polarization beam splitter 15 passes through the optical length compensator 17, and is deflected by the mirror 19. The optical length compensator 17 is included for matching the optical length of a light beam (beam A) deflected by the mirror 18 with that of a light beam (beam B) deflected by the mirror 19. The optical length compensator 17 may be excluded when a coherence length offered by the coherent light source 1 employed is much longer than an optical path difference between the two beams.

The reflecting (mirror) surfaces of the mirrors 18 and 19 lie parallel to the yz plane defined in the coordinate system shown in FIG. 3. An angle of incidence $\theta 0$ defined by the reflecting surfaces is 45°. At this time, the directions of polarization in which the beams A and B are polarized are both the direction of s-polarized light. Interference fringes F arranged in the X direction are, as shown in FIG. 3, produced in an area in which the beams A and B cross. The pitch P between interference fringes is expressed as follows:

$$P = \lambda/(2 \sin \theta 0) \quad (1)$$

where $\lambda$ denotes a wavelength provided by the coherent light source. When $\lambda=496$ nm and $\theta 0=45°$, the pitch P between interference fringes is 350 nm.

Next, the position-of-interference fringes control means 2 will be described. The position-of-interference fringes control means 2 is, as shown in FIG. 3, composed of interferometers 20 and actuators 21 connected to the mirrors 18 and 19, respectively. The interferometers 20 detect light reflected from the back surfaces of the mirrors 18 and 19. Thus, the magnitude of a displacement made by the mirror 19 can be measured. The displacement is made in the X direction, $\omega y$ direction (rotating about the Y axis), or $\omega z$ direction (rotating about the Z axis) in the coordinate system shown in FIG. 3.

Herein, it is important for controlling the position of the interference fringes with respect to three axes. The three axes are an axis resting along a plane perpendicular to the surface of the mirror 19, and two axes orthogonal to the axis about which the mirror 19 rotates. An advance or turn of the beam A within the mirror surface of the mirror 19 does not lead to a shift of the interference fringes. An angle at which the interferometers 20 are placed is determined according to an initial set angle of the mirror 19. Thus, interferometers capable of measuring the displacements along or about three axes are adopted as the interferometers 20 in this embodiment. Normally, a command value is sent to the actuators 21 in order to servo-control the actuators 21, so that the outputs relevant to the three axes of the interferometers 20 will remain constant. The positions of the mirrors 18 and 19 are thus controlled. For changing the angles $\omega y$ and $\omega z$ of the mirrors 18 and 19 or the positions in the X direction thereof, the target values set for servo control are modified so that the outputs relevant to the three axes of the interferometers 20 will assume desired values.

Alternatively, only the interferometer 20 and actuator 21 connected to the mirror 19 may be included. Thus, the position of the mirror 19 alone may be controlled in order to control the position of the interference fringes. In anticipation of a change in the height of produced interference fringes, the heights of the interference fringes producing means 1 and position-of-interference fringes control means 2 are adjusted uniformly. The adjustment is made along with controlling the angles $\omega y$ and $\omega z$ and the position in the X direction.

Next, the position-of-interference fringes detecting means 3 will be described. The position-of-interference fringes detecting means 3 employed in this embodiment is, as shown in FIG. 3, composed of the coherent light source 11, the beam splitter 13, a mirror 29, a polarization beam splitter 31a, a mirror 32a, frequency modulators 33a and 33b, a mirror 32b, a polarization beam splitter 31b, a beam splitter 34, a beam splitting prism 35, a sheet polarizer 36a, a light-receiving element 37a, the polarization beam splitter 15, the optical length compensator 17, the half-wave plate 16, the mirrors 18 and 19, a diffraction grating 39 on the reference mark base 38, a sheet polarizer 36b, light-receiving elements 37b, 37c, and 37d, and a phase difference meter 30. Among these components, the coherent light source 11, beam splitter 13, polarization beam splitter 15, optical length compensator 17, half-wave plate 16, and mirrors 18 and 19 are shared with the interference fringes producing means 1.

Part of the light emanating from the coherent light source 11 is reflected from the beam splitter 13, and reflected from the mirror 29. The light is then bifurcated by the polarization beam splitter 31a that produces p-polarized light (s-polarized light) oriented at an angle of 45° with respect to the direction of linearly polarized light. Reflected s-polarized light is frequency-modulated by the frequency modulator 33a such as an acousto-optic modulator (AOM), whereby the frequency f of the light is modified by a frequency f1. The resultant light having a frequency f+f1 is deflected by the mirror 32b, and falls on the polarization beam splitter 34. On the other hand, p-polarized light transmitted by the polarization beam splitter is deflected by the mirror 32b, and frequency-modulated by the frequency modulator 33b such as an AOM. The frequency of the light is modified by a frequency f2. The resultant light having a frequency f+f2 is incident on the polarization beam splitter 34. The s-polarized light of the frequency f+f1 and the p-polarized light of the frequency f+f2, which are incident on the polarization beam splitter 34, are synthesized with each other. Part of synthetic light produced by the beam splitter 34 travels in a direction corresponding to the leftward direction in the drawing. After the directions of polarization of rays of the light are matched with one another by the sheet polarizer 36a, the light is received by the light-receiving element 37a. Synthetic light advancing in a direction corresponding to the rightward direction in the drawing through the beam splitter 34 is trisected into three parallel beams by means of the beam splitting element 35.

Figure 4:
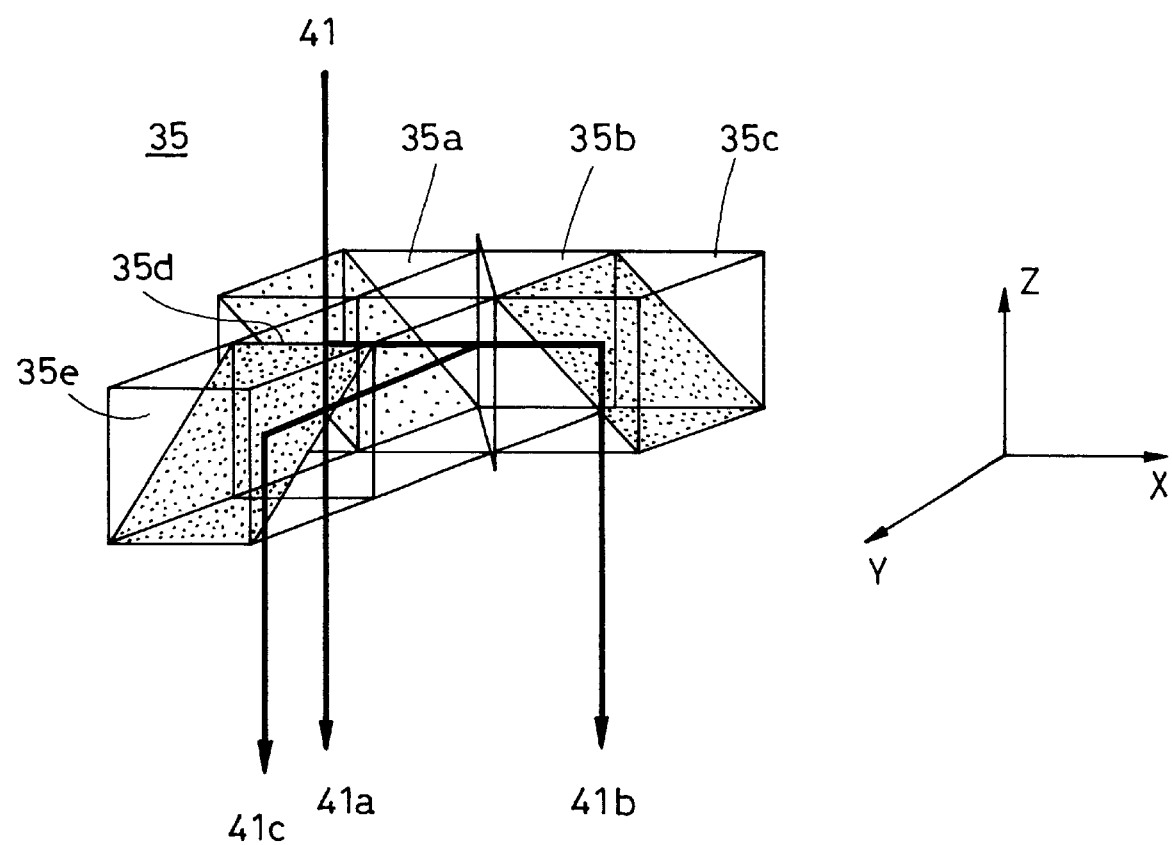
FIG. 4 shows a beam splitting means employed in the position-of-interference fringes detecting means in the first embodiment.

FIG. 4 shows the structure of the beam splitting element 35. The beam splitting element 35 is a prism formed by uniting two beam splitters 35a and 35b, mirror prisms 35c and 35e, and a glass cube 35d. Synthetic light 41, produced by the beam splitter 34 so that it will propagate on the same optical path, falls on the beam splitter 35a. Part of the light is transmitted by the beam splitter (light 41a). Light reflected from the beam splitter 35a is bifurcated by the beam splitter 35b. Transmitted light is deflected by the mirror prism 35c (light 41b). Light reflected from the beam splitter 35b passes through the glass cube 35d. The light is then deflected by the mirror prism 35e (light 41c). The transmittance and reflectance of the beam splitters 35a and 35d and the reflectance of the mirror prisms 35c and 35b are designed so that the intensities of three beams (41a, 41b, and 41c) will become nearly equal to one another.

Referring back to FIG. 3, the thus produced three beams fall on the polarization beam splitter 15. The s-polarized light having the frequency f+f1 is reflected, while the p-polarized light having the frequency f+f2 is transmitted. The reflected s-polarized light is converted into p-polarized light by the half-wave plate 16, and deflected by the mirror 18. The p-polarized light transmitted by the polarization beam splitter 15 passes through the optical length compensator 17. The p-polarized light is then deflected by the mirror 19.

Figure 5:
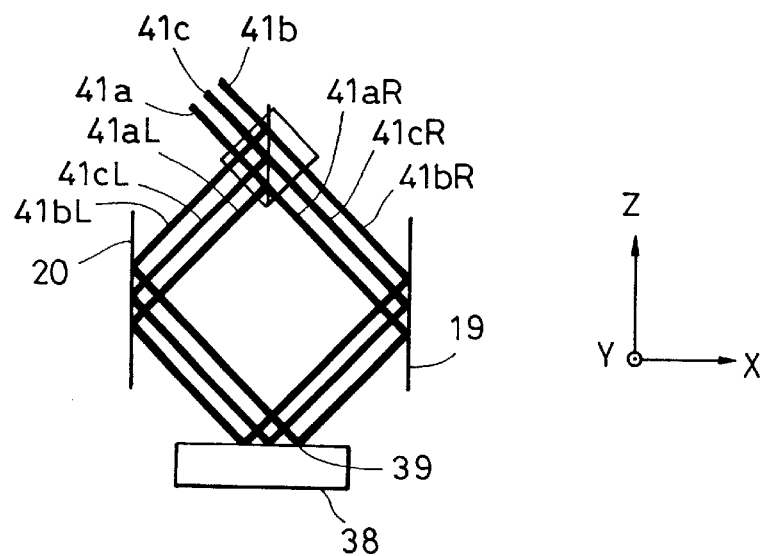
FIG. 5 is a diagram for explaining the position-of-interference fringes detecting means in the first embodiment.

FIG. 5 shows three beams overlapped on the reference mark base 38. As shown in FIG. 5, the top of the reference mark base 38 is level with the top of the substrate 7. On the top of the reference mark base 38, light beams 41cR and 41cL overlap mutually, light beams 41bR and 41aL overlap mutually, and light beams 41aR and 41bL overlap mutually.

Figure 6:
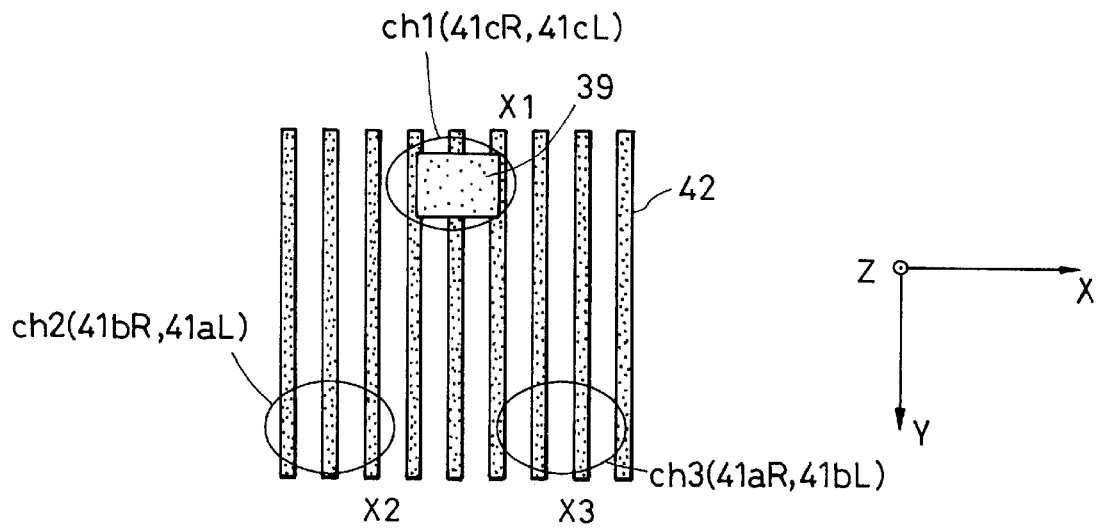
FIG. 6 shows the position of interference fringes detected by the position-of-interference fringes detecting means in the first embodiment.

FIG. 6 is an illustrative diagram of the reference mark base 38. As shown in FIG. 6, the stage 5 (shown in FIG. 2) is driven so that marks of the diffraction grating 39 on the reference mark base 38 will be located at positions at which the beams overlap mutually. A positional deviation of the diffraction grating 39 on the reference mark base 38 is detected sequentially at three positions ch1, ch2, and ch3. The position ch1 is a position on the reference mark base 38 at which the light beams 41bR and 41aL mutually overlap. The position ch2 is a position at which the light beams 41aR and 41bL mutually overlap. The position ch3 is a position at which the light beams 41aR and 41bL mutually overlap. Reference numeral 42 denotes interference fringes created by the beams A and B.

The diffraction grating 39 is a linear diffraction grating having slits thereof arranged in the X direction. The pitch between adjoining slits of the diffraction grating 39, P, is $0.496\,\mu m/\sin(45°)=0.7\,\mu m$. When light having a wavelength of $0.496\,\mu m$ falls on the diffraction grating 39 at an angle of incidence of 45°, diffracted light is propagated in the direction (Z direction) of the normal resting on the diffraction grating 39. When the marks of the diffraction grating 39 are located at the measurement positions ch1, ch2, and ch3, diffracted light beams of light beams entering from both sides are received by the light-receiving elements 37b, 37c, and 37d. Outputs of the light-receiving elements 37b, 37c, and 37d are input as signals to the phase difference meter 30. Thus, phase differences from a reference signal output from the light-receiving element 37a are detected.

Next, the principles of detecting a positional deviation of interference fringes will be described. An alternate-current component of the reference signal detected by the light-receiving element 37a is a sine wave having a beat frequency (f1–f2), expressed as follows:

$$Ir = A \times \cos\{2\pi(f1-f2)t + (\phi 1 - \phi 2)\} \qquad (2)$$

where A denotes a constant, t denotes time, $\phi 1$ denotes a phase of light having the frequency f+f1, and $\phi 2$ denotes a phase of light having the frequency f+f2. Moreover, assume that diffracted light produced by the portion of the diffraction grating 39 located at the position ch1 is received by the light-receiving element 37b. At this time, an alternating-current component of a signal output from the light-receiving element 37b is a sine wave having the beat frequency (f1–f2), expressed as follows:

$$I1 = B \times \cos\{2\pi(f1-f2)t + (\phi 1 - \phi 2) + d\phi 1 + 4\pi X1/P\} \qquad (3)$$

where B denotes a constant, $d\phi 1$ denotes a phase difference dependent on an optical path difference from the beam splitter 34 to the diffraction grating 39 between the light beams 41cR and 41cL, X1 denotes a positional deviation in the X direction of the diffraction grating 39 from the interference fringes 42 detected at the position ch1, and P denotes the pitch of the diffraction grating 39.

Moreover, assume that diffracted light produced by the portion of the diffraction grating 39 located at the position ch2 is received by the light-receiving element 37c. At this time, an alternating-current component of a signal output from the light-receiving element 37c is a sine wave having the beat frequency (f1–f2), expressed as follows:

$$I2 = C \times \cos\{2\pi(f1-f2)t + (\phi 1 - \phi 2) + d\phi 2 + 4\pi X2/P\} \qquad (4)$$

where C denotes a constant, t denotes time, $d\phi 2$ denotes a phase difference dependent on an optical path difference from the beam splitter 34 to the diffraction grating 39 between the light beams 41bR and 41aL, and X2 denotes a positional deviation in the X direction of the diffraction grating 39 from the interference fringes 42 detected at the position ch2.

Moreover, assume that diffracted light produced by the portion of the diffraction grating 39 located at the position ch3 is received by the light-receiving element 37d. At this time, an alternating-current component of a signal output from the light-receiving element 37d is provided as a sine wave having the beat frequency (f1–f2), expressed as follows:

$$I3 = D \times \cos\{2\pi(f1-f2)t + (\phi1-\phi2) + d\phi3 + 4\pi X3/P\} \quad (5)$$

where D denotes a constant, t denotes time, $d\phi3$ denotes a phase difference dependent on an optical path difference from the beam splitter 34 to the diffraction grating 39 between the light beams 41aR and 41bL, and X3 denotes a positional deviation in the X direction of the diffraction grating 39 from the interference fringes 42 detected at the position ch3.

The phase differences $d\phi1$, $d\phi2$, and $d\phi3$ in the formulas (3), (4), and (5) assume fixed values. A procedure of excluding the fixed values will be described later.

The phase difference meter 30 is used to detect a phase difference between the reference signal expressed by the formula (3) and the signal detected at the position ch1 and expressed by the formula (3). The fixed values are excluded from a formula expressing the phase difference. This brings about the following formula expressing a phase difference detection signal:

$$\phi ch1 = 4\pi X1/P \quad (6)$$

The phase difference detection signal is proportional to a positional deviation of the diffraction grating 39 from the interference fringes 42 detected at the position ch1.

A range of measurement is a range of $\pm P/4$ or a range of multiples of $\pm\pi$. Similarly, the phase difference meter 30 is used to detect a phase difference between the reference signal expressed by the formula (2) and the signal detected at the position ch2 and expressed by the formula (4). The fixed values are excluded from a formula expressing the phase difference. This brings about the following formula expressing a phase difference detection signal:

$$\phi ch2 = 4\pi X2/P \quad (7)$$

The phase difference detection signal is proportional to a positional deviation of the diffraction grating 39 from the interference fringes 42 detected at the position ch2.

Furthermore, the phase difference meter 30 is used to detect a phase difference between the reference signal expressed by the formula (2) and the signal detected at the position ch3 and expressed by the formula (5). The fixed values are excluded from a formula expressing the phase difference. This brings about the following formula expressing a phase difference detection signal:

$$\phi ch3 = 4\pi X3/P \quad (8)$$

The phase difference detection signal is proportional to a positional deviation of the diffraction grating 39 from the interference fringes 42 detected at the position ch3.

By rewriting the formulas (6), (7), and (8), positional deviations X1, X2, and X3 are given. The positional deviations X1, X2, and X3 are deviations of the interference fringes from the original positions detected at the positions ch1, ch2, and ch3 with the X axis of the stage 5 as a reference. The reason why the position of the stage 5 is specified is presumably that the interferometers (not shown in FIG. 2) are incorporated in the stage. Therefore, measurement positions at which interference is measured by the interferometers are regarded as reference points. Using the positional deviations X1, X2, and X3 calculated from the formulas (6), (7), and (8), a shift error Sx of the interference fringes 42 relative to the axis of the stage 5, a magnification error $\beta$, and a rotational error $\omega z$ are calculated according to the formulas below.

The shift error Sx is given as follows:

$$Sx = (X1+X2+X3)/3 \quad (9)$$

The magnification error $\beta$ is given in relation to a distance Lx in the X direction between the measurement positions ch2 and ch3 as follows:

$$\beta(X2-X3)/Lx \quad (10)$$

The rotation error $\omega z$ is given in relation to a distance Ly in the Y direction between the measurement positions ch1 and ch2 as follows:

$$\omega z = \{X1 - (X2+X3)/2\}/Ly \quad (11)$$

Incidentally, the distance between the measurement positions ch1 and ch3 is the same as the distance Ly.

Next, a description will be made of a procedure of measuring the phase differences $d\phi1$, $d\phi2$, and $d\phi3$, which assume the fixed values (offset values), contained in the formulas (3), (4), and (5).

A diffraction grating having the same pitch as that of the diffraction grating 39 is created on the substrate 7. A resist is then applied to the diffraction grating. A wafer having the diffraction grating created thereon is loaded on the lithography system so that slits of the diffraction grating will be arranged in the X direction. A mark of the diffraction grating is aligned with the position ch1. Thereafter, the phase difference +ch1 is detected according to the foregoing procedure. The positional deviation X1 is then calculated according to formula (6). The stage 5 is driven in the X direction according to the positional deviation X1 so that the phase difference +ch1 will be nil. Thus, the substrate 7 is aligned. Thereafter, alignment light 41 (FIG. 4) is intercepted by a stopper 40, and the diffraction grating 50 (FIG. 7) is exposed to interference fringes.

Figure 7:
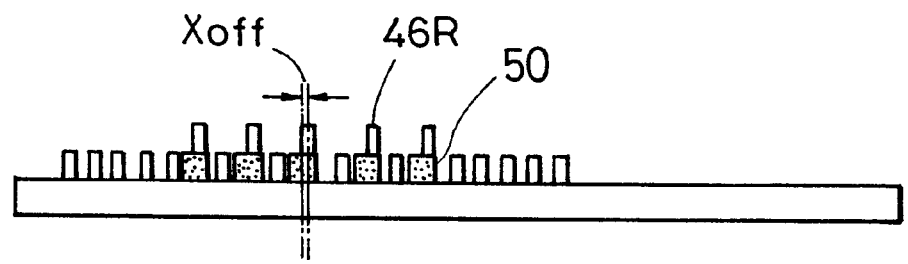
FIG. 7 shows a method of measuring a fixed value (offset value) set in the position-of-interference fringes detecting means in the first embodiment.

Thereafter, the resist is developed. Consequently, a resist pattern 46R looking like a diffraction grating having a pitch of half that of the diffraction grating 50 is, as shown in FIG. 7, formed on the diffraction grating 50. A positional deviation Xoff between the diffraction grating 50 and diffraction grating-like resist pattern 46R is measured using a scanning electron microscope (SEM). The positional deviation Xoff is equivalent to a positional deviation calculated by transforming the phase difference $d\phi1$ of a fixed value. The same procedure is repeated in relation to the positions ch2 and ch3. This results in phase deviations calculated by transforming the phase differences $d\phi2$ and $d\phi3$ of fixed values. The offset value Xoff set for an alignment detection unit associated with each measurement position is subtracted from the value provided by the formula (6), (7), or (8). Thus, the offset value can be excluded. This procedure may be executed only once after the completion of assembling the components of the lithography system (alignment unit). This will not lead to a decrease in throughput.

Figure 8:
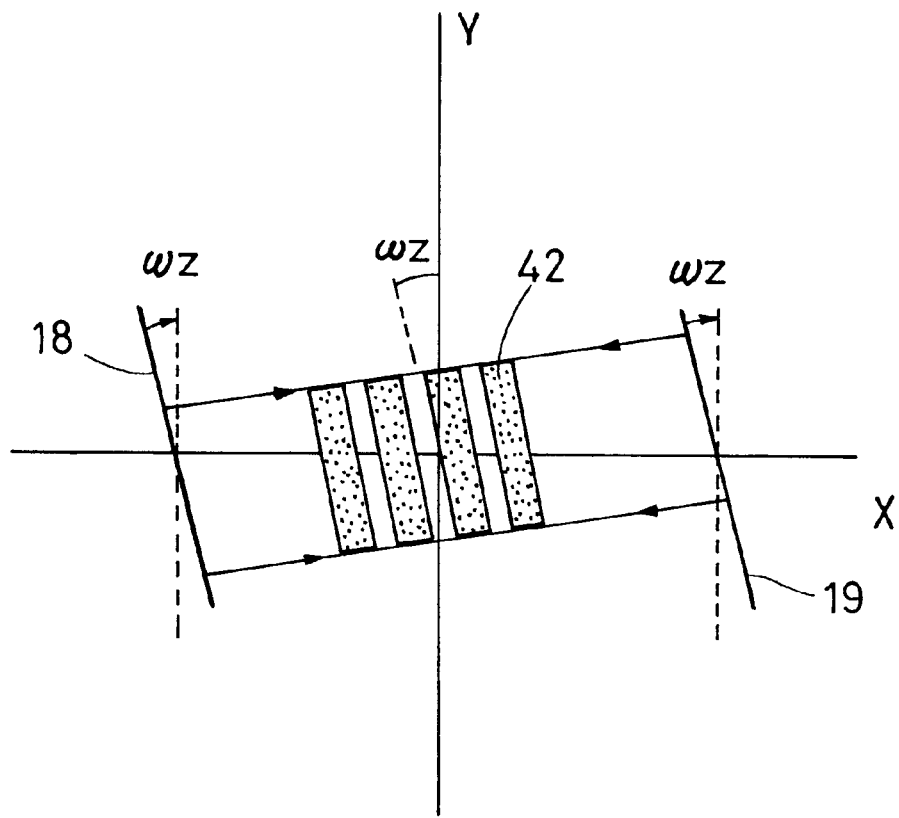
FIG. 8 shows a rotation error of interference fringes in the first embodiment.

Next, a procedure of aligning interference fringes will be described. To compensate for a shift error, the mirrors 18 and 19 are driven in the X direction by a magnitude canceling a shift provided by the formula (9). To compensate for a rotation error, the mirrors 18 and 19 are driven in a $-\omega z$ direction by a magnitude (see FIG. 8) canceling a magnitude of rotation provided by the formula (11). To compensate for a magnification error $\beta$, the mirrors 18 and 19 are driven in an oy direction.

Figure 9:
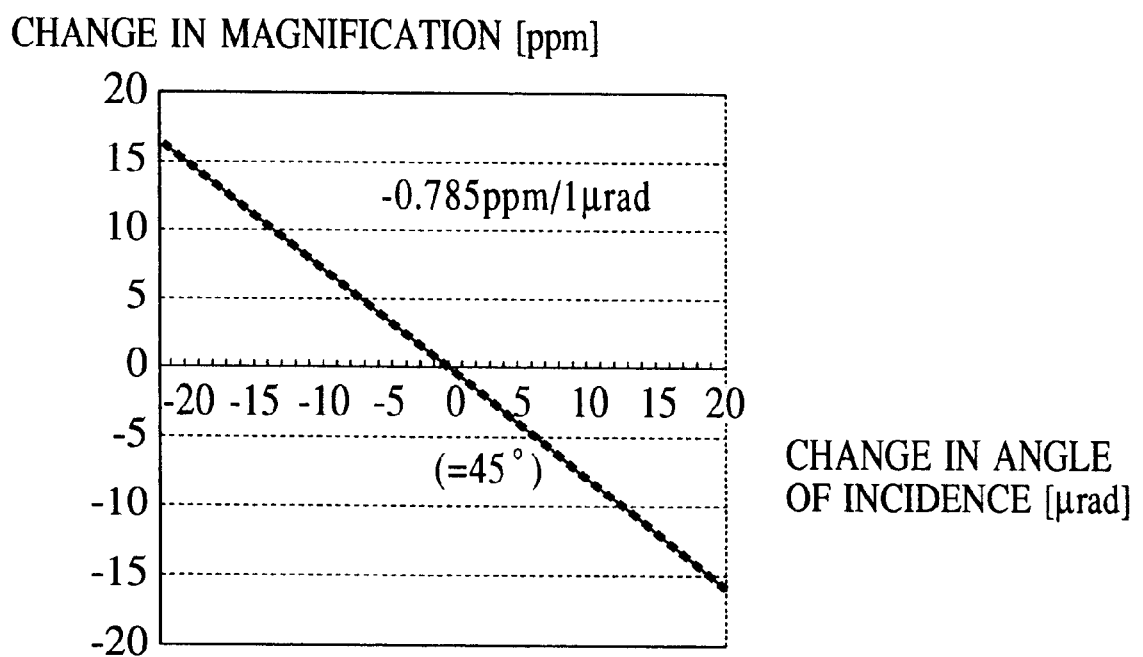
FIG. 9 is a diagram for explaining correction of a magnification for interference fringes in the first embodiment.

FIG. 9 graphically shows a calculated change in the magnification (pitch) for interference fringes occurring when an angle of incidence changes from 45° by $\pm 20\ \mu$rad. As seen from FIG. 9, the magnification for the interference fringes changes by −0.785 ppm with a change in the angle of incidence of 1 $\mu$rad. A change in the angle of incidence necessary to change the magnification for the interference fringes by 1 ppm is −1.27 μrad. Furthermore, the angle of incidence changes with twice a higher degree of sensitivity, responsive to a change in the ωy direction in the angle of the mirrors 18 and 19. From this viewpoint, a change in the ωy direction in the angle of the mirrors 18 and 19 necessary to change the magnification for the interference fringes by 1 ppm is −0.64 μrad. To compensate for the magnification error β, the mirrors 18 and 19 should be shifted in the ωy direction by 0.64β μrad.

According to the foregoing procedure, the pattern of the interference fringes can be aligned with the coordinate axes of the substrate stage 5. When no pattern is drawn on the substrate or when it is unnecessary to align the pattern of interference fringes with a pattern of circuits on a base, alignment is elementally completed with the foregoing procedure alone.

Finally, a technique of detecting the position of a substrate on which a pattern of circuits is drawn will be described.

Figure 10:
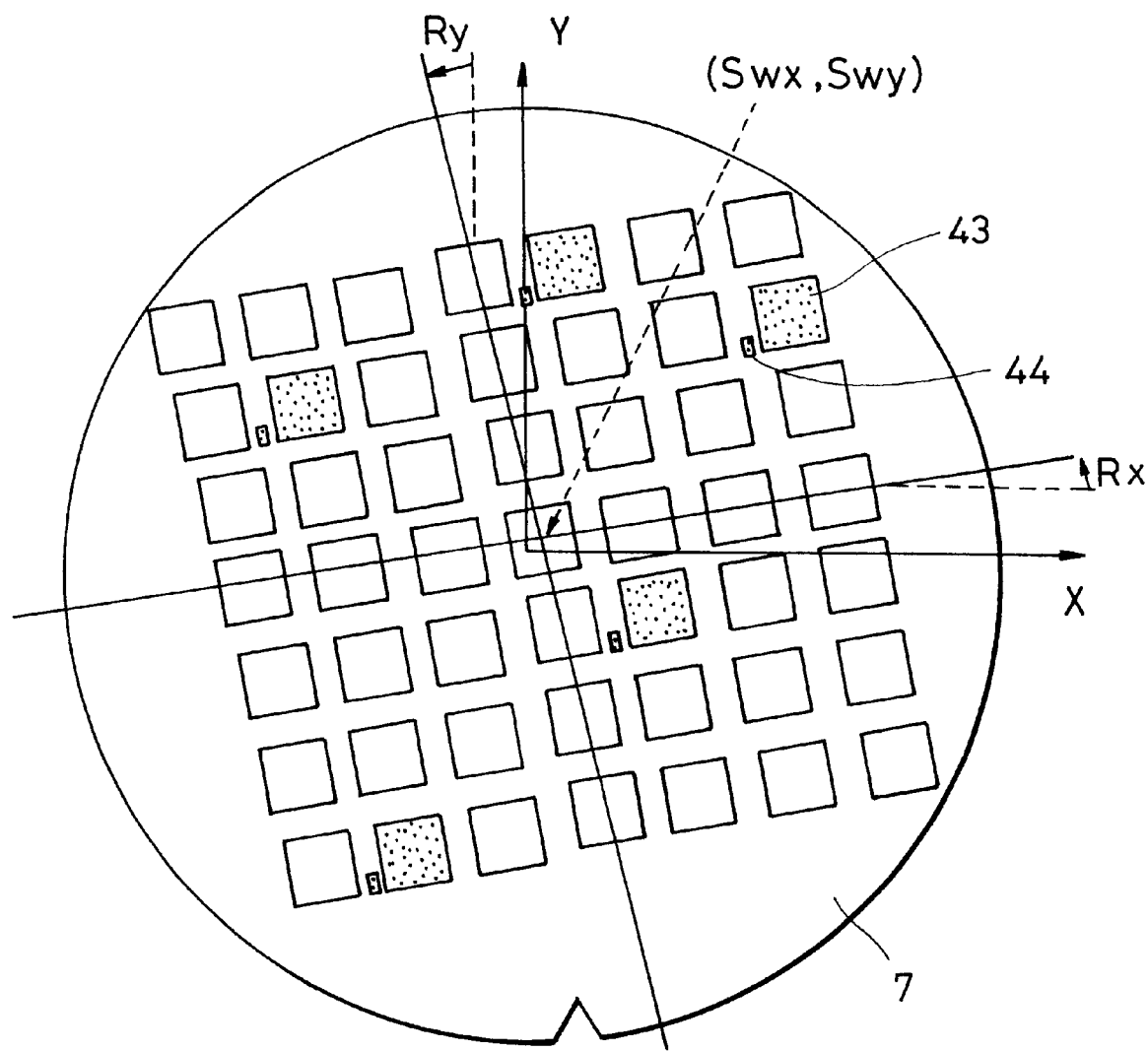
FIG. 10 shows an array of shot locations on a wafer in the first embodiment.

FIG. 10 is an explanatory diagram showing the substrate 7 on which a pattern of circuits 43 of a lower layer is drawn at numerous shot locations. Alignment marks 44 are formed near the shot locations at which the pattern of circuits 43 is formed, that is, on scribed lines. The alignment marks 44, which are created simultaneously with the pattern of circuits 43, reflect a positional deviation of the pattern of circuits 43.

FIG. 11A to FIG. 11D show an alignment mark and an alignment scope (position-of-substrate detecting means) employed in this embodiment, and a method of processing an image produced by the alignment scope. An alignment mark 44 is, as shown in FIG. 11A, composed of a position-in-X direction detecting mark 44X that consists of four bars, and a position-in-Y direction detecting mark 44Y that consists of four bars.

The alignment scope 4 in FIG. 11B consists of an alignment light illumination unit 50, a half mirror 51, a magnification lens 52, and a CCD camera 53. An image signal representing a magnified image of the alignment mark 44 is integrated in a direction perpendicular to a direction in which alignment is detected (one-dimensional integration). This results in a distribution of light intensities like, for example, the one shown in FIG. 11C. A center position pm between positions of the apices of two out of four triangles is retrieved from the distribution of light intensities, whereby a positional deviation of the alignment mark 44 is calculated.

The position-of-substrate detecting means is not limited to the foregoing form. Alternatively, a detecting means for detecting light scattered from the edge of a mark will do. Otherwise, a detecting means using a diffraction grating as an alignment mark to detect a phase shift of diffracted light will do.

An alignment mark 44 on the substrate 7 is placed under the position-of-substrate detecting means 4 and aligned therewith using the substrate stage 5. Thus, a positional deviation of the alignment mark 44 is detected. Furthermore, positional deviations of the plurality of alignment marks 44 formed at the other positions on the substrate are detected in the same manner. Thus, a positional deviation of the substrate 7 from the coordinate axes of the substrate stage 5 can be detected. This method is referred to as a global alignment. According to this method, a positional deviation of an array of shot locations in a substrate from the axes of the substrate stage 5 is expressed with six parameters. The six parameters are a shift in the X-axis direction Swx, a shift in the Y-axis direction Swy, a rotation about the X axis Rx, a rotation about the Y axis Ry, a magnification in the X-axis direction βx, and a magnification in the Y-axis direction βy.

Assuming that the designed coordinates of each shot location to be measured are (Xi, Yi) and the actual coordinates thereof are (Xi', Yi'), the relationship between them can be expressed by a linear transformation as follows:

$$\begin{pmatrix} xi' \\ yi' \end{pmatrix} = \begin{pmatrix} 1+\beta x & -Ry \\ Rx & 1+\beta y \end{pmatrix} \begin{pmatrix} xi \\ yi \end{pmatrix} + \begin{pmatrix} Swx \\ Swy \end{pmatrix} \quad (12)$$

However, as far as an actual wafer is concerned, the measured values (Xi', Yi') are accompanied by residuals (Exi, Eyi) because of a warp of the wafer or the reproducibility of the alignment scope of reproducing a detected image. The actual values (Xi'', Yi'') are, therefore, expressed as follows:

$$\begin{pmatrix} xi'' \\ yi'' \end{pmatrix} = \begin{pmatrix} 1+\beta x & -Ry \\ Rx & 1+\beta y \end{pmatrix} \begin{pmatrix} xi \\ yi \end{pmatrix} + \begin{pmatrix} Swx \\ Swy \end{pmatrix} + \begin{pmatrix} Exi \\ Eyi \end{pmatrix} \quad (13)$$

The least squares method is used to minimize the sum of the squares of the residuals of the X components and the Y components. The sum of the squares of the residuals of the X components is calculated by the following formula:

$$\sum_i \{xi'' - (1+\beta x)xi + Ry \cdot yi - Swx\}^2 \quad (14)$$

Partial differential equations having unknowns βx, Ry, and Swx are defined with zero assigned as their left sides. These simultaneous equations are solved in order to thus calculate the values of the three parameters βx, Ry, and Swx.

Moreover, the sum of the squares of the residuals of the Y components in formula (13) is expressed as follows:

$$\sum_i \{yi'' - Rx \cdot xi - (1+\beta x)yi - Swy\}^2 \quad (15)$$

Partial differential equations having unknowns βy, Rx, and Swy are defined with zero assigned as their left sides. These simultaneous equations are solved in order to thus calculate the values of the three parameters βy, Rx, and Swy.

Herein, the parameters βx and βy represent the contraction or stretch of a wafer. The spacing between shot locations can be corrected by moving the stage 5 stepwise to change magnifications. However, the magnification for each shot location must be corrected by shifting interference fringes. In particular, care must be given to a superposition error stemming from a change in the magnification in a direction (X direction) in which interference fringes are arranged.

In this embodiment, calculated are, therefore, a magnification error β concerning interference fringes relative to the axes of the substrate stage 5, and a magnification error βx concerning the substrate 7 relative to the axes of the substrate stage 5. The mirrors 18 and 19 are then moved in the ωy direction by −0.64x(βx−β) μrad. This leads to the improved precision in superposing interference fringes on a pattern of circuits drawn at a shot location on the substrate 7. The same applies to an error occurring in a direction in which the substrate stage is turned (chip rotation). Namely, interference fringes are turned by (Rx−ωz) μrad, and the substrate stage is then exposed to the interference fringes in order to align the interference fringes with a pattern of circuits within a shot location.

Moreover, to compensate for a shift error and rotation error concerning interference fringes, instead of driving the mirrors 18 and 19, the substrate 7 may be shifted or turned to be offset. Thereafter, the substrate is exposed. In this case, the substrate stage 5 is moved in order to turn the substrate 7 by (ωz−Rx). Thereafter, interference fringes are aligned with each shot location according to the formula below.

$$\begin{pmatrix} xi' \\ yi' \end{pmatrix} = \begin{pmatrix} 1+\beta x & -(Ry+\omega z) \\ \omega z & 1+\beta y \end{pmatrix} \begin{pmatrix} xi \\ yi \end{pmatrix} + \begin{pmatrix} Swx \\ Swy \end{pmatrix} \quad (16)$$

In this system, an operator can select whether a shift error and rotation error are canceled by changing the position of interference fringes or by driving a substrate itself.

As mentioned above, a substrate having a pattern of circuits drawn thereon (alignment marks also created thereof) is exposed to interference fringes. Even in this case, a positional deviation (Sx, β, ωz) of the interference fringes is measured with the axes of the stage 5 as a reference. Meanwhile, a positional deviation of an alignment mark on the substrate is measured in order to measure a positional deviation of the pattern of circuits on the substrate with the axes of the stage 5 as a reference. A relative positional deviation of the interference fringes from the pattern of circuits on the substrate is then calculated. The substrate is exposed while the relative positional deviation is corrected. Consequently, the interference fringes can be superposed on the pattern of circuits highly precisely.

Figure 12:
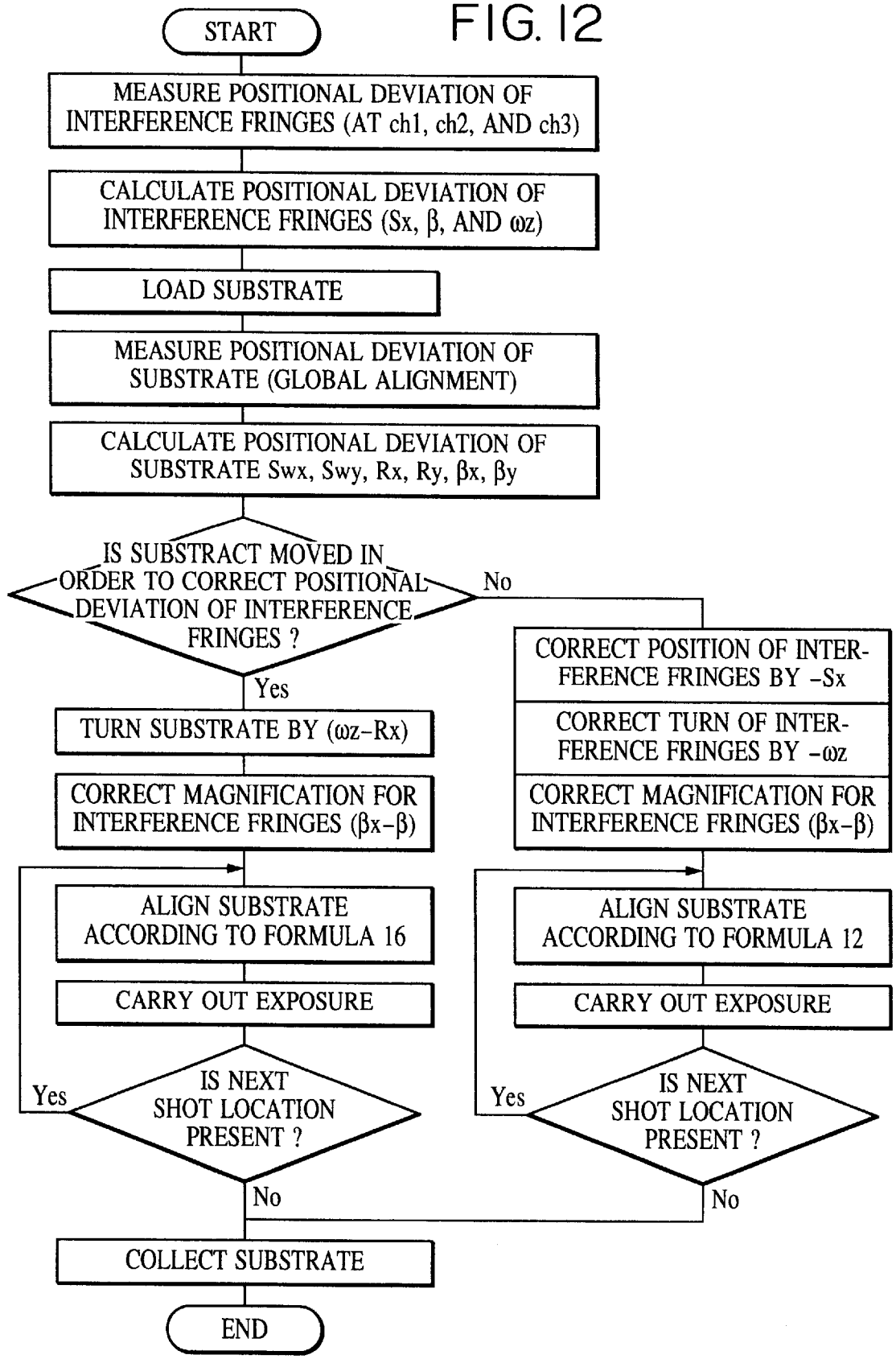
FIG. 12 describes an exposure sequence implemented in the first embodiment.

FIG. 12 outlines the foregoing alignment sequence.

The interference fringes producing means 1 and position-of-substrate detecting means 4 are installed apart. In an environment prone to a temperature change, a member bearing parts may dilate or contract. This leads to a change in the distance between a position at which interference fringes are produced by the interference fringes producing means 1 and the position-of-substrate detecting means 4. In this case, the distance change must be corrected (a so-called baseline must be corrected).

In this embodiment, a mark 44' equivalent to the position-of-substrate detection marks 44x and 44y shown in FIG. 11A is located near the diffraction grating 39 on the reference mark base 38. The position of the mark 44' on the reference mark base 38 is detected periodically by the position-of-substrate detecting means 4. Consequently, a positional deviation of the position-of-substrate detecting means 4 with the stage 5 as a reference can be measured.

FIG. 11D shows the principles of the correcting method. In the drawing, an axis AS is a reference axis of the position-of-substrate detecting means 4, and an axis W is an axis indicating the position of the substrate 7. An axis I is an axis indicating the position of interference fringes produced by the interference fringes producing means 1. An axis FI indicates the position of the diffraction grating 39 on the reference mark base 38. An axis FW indicates the position of the mark 44' on the reference mark base 38.

A distance DI between the position FI of the diffraction grating 39 and the position I of the interference fringes is calculated by detecting a positional deviation of the interference fringes. A distance D2 between the reference axis AS of the position-of-substrate detecting means 4 and the position W of the substrate is calculated by detecting a positional deviation of the substrate. A distance D3 between the position FW of the mark 44' and the reference axis AS of the position-of-substrate detecting means 4 is calculated by detecting a positional deviation of the mark 44' using the position-of-substrate detecting means 4. A spacing DW between the position FI of the diffraction grating 39 and the position W of the substrate 7 is expressed as DW=D2−(D3+ D0) where D0 denotes a distance (designed value) between the diffraction grating 39 and mark 44'. The position D1 of the interference fringes with respect to the diffraction grating 39 and the position Dw of the substrate 7 with respect to the diffraction grating 39 are thus calculated. Besides, the positional deviations of the interference fringes and substrate 7 are calculated with respect to the same reference. Consequently, a shift of the position-of-substrate detecting means 4 is corrected.

This embodiment has been described on the assumption that an argon laser offering a wavelength of 496 nm is used as a light source. The wavelength is not limited to 496 nm. For example, a second harmonic converter realized using a nonlinear optical element may be interposed between the argon laser 11 and crystal polarizer 12 shown in FIG. 3. Light having a wavelength of 248 nm may thus be used as exposure light and alignment light. In this case, the pitch of the diffraction grating 39 for detecting a positional deviation of interference fringes should be set to Pg=0.248/sin(45°)= 0.35 um. At this time, a pitch between exposed locations is given as P=0.175 um by the formula (1). Thus, a line and space having a linewidth of 0.1 um or less can be resolved.

Moreover, in this embodiment, a light source is used in common for exposure light and alignment light. Light sources to be used exclusively for exposure light and alignment light may be included separately.

Figure 13:
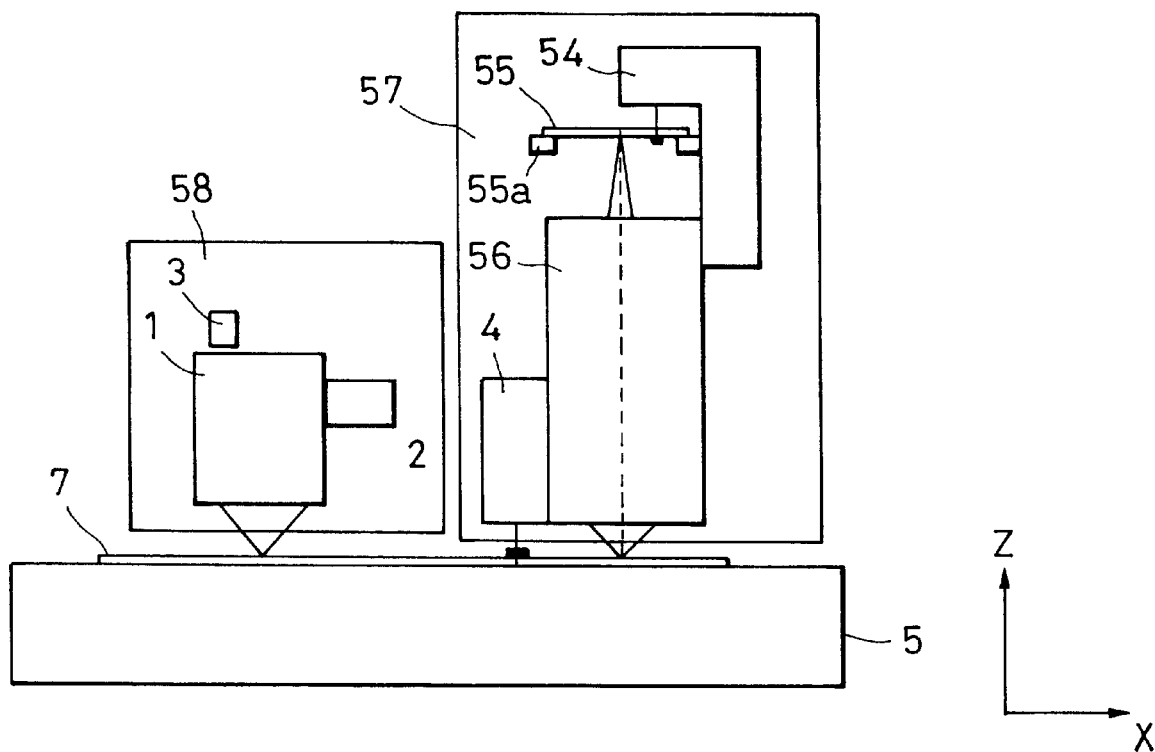
FIG. 13 is an illustrative diagram of an interference fringes-based lithography system in accordance with a second embodiment of the present invention.

FIG. 13 shows the outline configuration of a semiconductor lithography system in accordance with the second embodiment of the present invention.

In FIG. 13, there are shown a two-beam interference fringes-based lithography unit 58, and a step-and-repeat photolithography unit with demagnification 57. Also shown are a substrate 7 and a substrate stage 5. The two-beam interference fringes-based lithography unit 58 consists of an interference fringes producing means 1, a position-of-interference fringes control means 2, and a position-of-interference fringes detecting means 3. The abilities of these means are the same as those described in conjunction with the first embodiment.

The step-and-repeat photolithography unit with demagnification 57 consists basically of a reticle stage 55a and reticle alignment unit 54 for holding a reticle 55, a demagnification and projection lens 56, and a position-of-substrate detecting means 4. The reticle 55 is illuminated by an exposure light irradiating means that is not shown. A pattern on the reticle 55 is demagnified and projected onto a substrate. The stroke of the substrate stage 5 is large enough to drive the whole substrate 7 to both a position at which it is exposed by the beam interference fringes-based lithography unit 58, and a position at which it is exposed by the step-and-repeat photolithography unit with demagnification 57.

Figure 14:
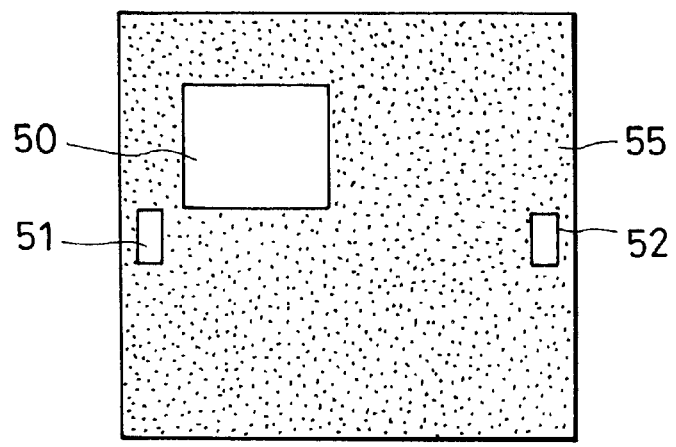
FIG. 14 shows a reticle employed in the second embodiment.

FIG. 14 is an illustrative diagram of a reticle. The reticle alignment unit 54 detects positional deviations of reticle alignment marks 51 and 52. The reticle stage 55a is used to align the reticle 55 with the axes of the stage 5. The position-of-substrate detecting means 4 detects, as described in conjunction with the first embodiment, a positional deviation of a pattern of circuits on the substrate 7 from the axes of the stage 5 (global alignment). In the lithography system of this embodiment, any of three modes described in the exposure sequence of FIG. 15 can be, as described later, selected as a method of lithography. The three modes are a mode in which step-and-repeat photolithography with demagnification is carried out, a mode in which both step-and-repeat photolithography with demagnification and interference lithography are carried out, and a mode in which interference lithography alone is carried out, as described in FIG. 15.

In the step-and-repeat photolithography with demagnification mode, a reticle is aligned with the stage, and the substrate 7 is loaded on the lithography system. The substrate is aligned according to the foregoing procedure. Namely, a positional deviation of each shot location on the substrate from the axes of the stage 5 is calculated. The stage 5 is moved stepwise until a shot location to be exposed is not found. Thus, step-and-repeat photolithography with demagnification is performed while the positional deviation is corrected.

In the interference lithography mode, interference fringes are aligned with a pattern of circuits as mentioned previously. The substrate 7 is loaded on the lithography system, and aligned as mentioned previously. A positional deviation of each shot location on the substrate from the axes of the stage 5 is calculated. The stage 5 is moved until a shot location to be exposed is not found. Thus, the substrate is exposed to interference fringes while the positional deviation is corrected.

In the mode in which both step-and-repeat photolithography with demagnification and interference lithography are carried out, a reticle is aligned with the stage, and interference fringes are aligned with a pattern of circuits. The substrate 7 is loaded on the lithography system, and aligned. A positional deviation of each shot location on the substrate from the axes of the stage 5 is calculated. The stage 5 is moved stepwise until a shot location to be exposed is not found. Thus, the substrate is exposed to interference fringes while the positional deviation is corrected. The stage 5 is moved stepwise again until a shot location to be exposed is not found. Thus, step-and-repeat photolithography with demagnification is carried out while the positional deviation is corrected.

Using both the step-and-repeat photolithography with demagnification mode and interference lithography mode, only a necessary area of a resist applied to an effective area of exposure offered by the interference fringes exposure unit can be exposed. This method will be described in conjunction with FIG. 14 and FIGS. 16A and 16B.

Figure 16A:
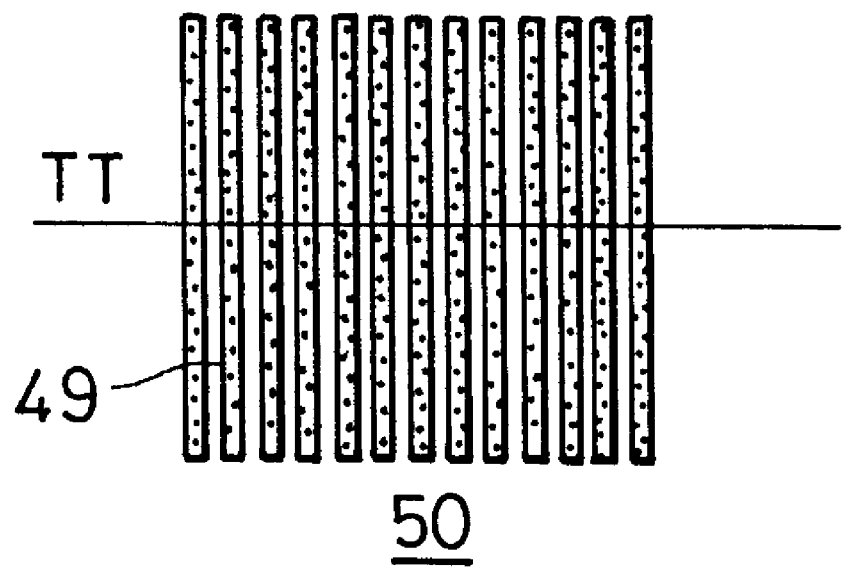
FIG. 16A and FIG. 16B are diagrams for explaining multi-lithography implemented in the second embodiment.
Figure 16B:
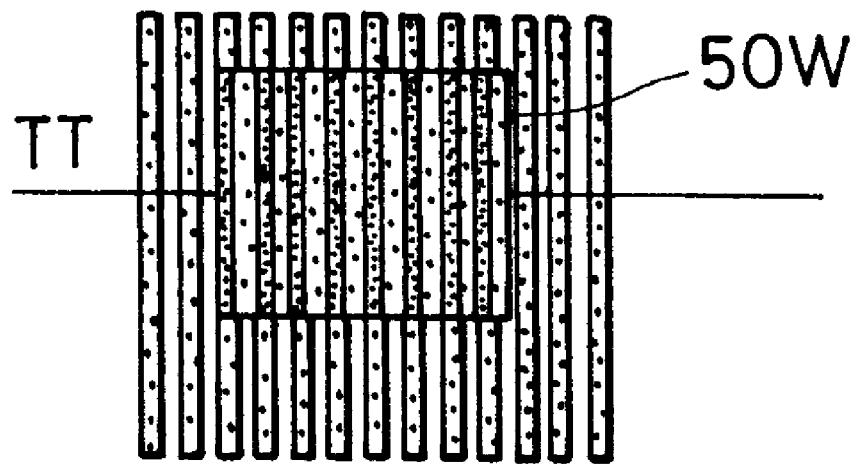

Assume that the effective area of exposure offered by the interference fringes exposure unit corresponds to an area 50 in FIG. 16A. A discussion will be made of a case in which a resist present in a region 50W shown in FIG. 16B should be exposed in order to form a pattern of lines and spaces inside the region 50W alone. In this case, a mask employed for step-and-repeat photolithography with demagnification has, as shown in FIG. 14, an aperture coincident with the region 50W shown in FIG. 16B. Exposure light is passed through the aperture. First, the two-beam interference fringes lithography unit 58 projects a pattern of interference fringes 49 at an exposure level (for example, Eth/2) lower than a level Eth at which a resist employed reacts to light.

FIG. 17A shows a distribution of exposures 46 observed on the substrate. In addition to the pattern of interference fringes, a pattern 50 drawn on a reticle is projected on the region 50W by the step-and-repeat photolithography unit with demagnification 57. A distribution of total exposures resulting from two times of exposure is, as shown in FIG. 17B, the sum of the distribution of exposures 46 deriving from the interference fringes and a distribution of exposures 47 caused by the step-and-repeat photolithography unit with demagnification. The distribution of total exposures is shown as a distribution of exposures 48 in FIG. 17B. Portions of a resist 45 having undergone an exposure of the photosensitive level Eth (hatched parts of FIG. 17C) react to light. Thereafter, the substrate is developed. Consequently, as shown in FIG. 17D, a pattern of lines and spaces is drawn only in the region 50W.

According to the above description, a positive resist is employed. Portions of the positive resist having undergone a certain exposure or more react to light, and resolve when developed. Alternatively, a negative resist may be employed. Portions of the negative resist having undergone a certain exposure or less resolve when developed. When the negative resist is used, the interference lithography is adopted in order to expose the resist to an extent that the resist reacts to light and permits formation of a pattern of lines and spaces. The step-and-repeat photolithography with demagnification is adopted in order to expose a portion of the resist coincident with the perimeter of the region 50W. A reticle employed in the step-and-repeat photolithography with demagnification is, unlike the one shown in FIG. 14, structured to have the area 50 as an interceptive portion.

As mentioned above, the multi-lithography composed of the interference lithography and step-and-repeat photolithography with demagnification is adopted. A pattern of lines and spaces can therefore be formed only in a region defined by a reticle.

In this embodiment, an argon laser offering a wavelength of 496 nm is used as a light source for interference lithography. A second-harmonic converter is used to convert the laser light into light having a wavelength of 248 nm. Moreover, a KrF excimer laser (wavelength of 248 nm) is used as a light source for step-and-repeat photolithography with demagnification. The exposure light beams used for interference lithography and step-and-repeat photolithography with demagnification have the same wavelength. This is preferable for the multi-lithography composed of the interference lithography and step-and-repeat photolithography with demagnification, because consideration need not be taken into the chromatic dispersion of the sensitivity of a resist.

The lithography system in accordance with each of the aforesaid embodiments is used to transfer a pattern to a resist and then develop the resist. The pattern is used to carry out etching, deposition, and cleaning. This processing sequence, application of a resist, and exposure are carried out several times, whereby circuits are formed on a substrate. Consequently, semiconductor chips are manufactured. Well-known techniques can be adopted for steps constituting a process of manufacturing devices except a step of exposure. The techniques will, therefore, not be described.

Moreover, the embodiments are concerned with a semiconductor lithography system. The present invention can successfully apply to a lithography system used to manufacture devices including a liquid crystal panel.

As described above, light passing through an interference optical system is detected in order to align interference fringes with a pattern of circuits. The interference fringes can therefore be aligned based on accurate information of a position at which interference fringes are actually produced. When the alignment is carried out based on phase information of interference light, a resolution exhibited by position information will be so high as to fall below a pitch between adjoining ones of slits constituting a diffraction grating. The interference light is composed of diffracted light beams produced by the diffraction grating to which the light passing through the interference optical system is irradiated. Moreover, the inclusion of a means for controlling the position of a photosensitive member and aligning the photosensitive member leads to high-precision alignment of interference fringes with a pattern drawn on the photosensitive member. The photosensitive member has the pattern formed on a base thereof. Furthermore, if a system is designed to have a step-and-repeat photolithography unit with demagnification and the interference optical system juxtaposed, the one system can execute step-and-repeat photolithography with demagnification and two-beam interference lithography. The system is suitable for the multi-lithography composed of the step-and-repeat photolithography with demagnification and two-beam interference lithography.

Moreover, a positional deviation of interference fringes is detected for positioning the interference fringes. A positional deviation of a pattern on a substrate is detected for positioning the pattern. This enables precise exposure of the pattern on the substrate to the interference fringes. In particular, when the interference fringes are controlled according to a displacement of a reflecting means for producing interference fringes, the interference fringes can be positioned easily and accurately. Moreover, when a reference mark base is placed on a substrate stage, phase information of diffracted light beams produced by a diffraction grating is acquired in order to detect the position of the interference fringes. This enables more accurate positioning of the interference fringes. In particular, if a signal representing the phase information is frequency-modulated and a phase difference from a reference signal is detected, the accuracy in positioning will improve further. Moreover, a positional deviation of interference fringes may be detected in terms of three parameters. The three parameters are a shift (Sx) in a direction in which the interference fringes are arranged, a magnitude of rotation ($\omega z$), and a magnification for the interference fringes ($\beta$). Moreover or otherwise, an error in patterning circuits may be detected in terms of six parameters. The six parameters are a shift error (Swx) in the X-axis direction, a shift error (Swy) in the Y-axis direction, a magnification error in the X-axis direction ($\beta x$), a magnification error in the Y-axis direction ($\beta y$), a rotation error (Rx) about the X axis, and a rotation error (Ry) about the Y axis. In this case, the interference fringes can be aligned with the pattern of circuits more accurately. A mark on a reference mark base may be detected by a position-of-substrate detecting means in order to correct a shift of the position-of-substrate detecting means with respect to the interference fringes. In this case, a baseline can be corrected easily and accurately.

Moreover, a step-and-repeat photolithography unit with demagnification and a two-beam interference lithography unit may be included. A positional deviation of interference fringes may then be detected for positioning the interference fringes. A positional deviation of a pattern drawn on a substrate may be detected for positioning the pattern. A reticle may be aligned with the step-and-repeat photolithography unit with demagnification, and the substrate may be positioned in the step-and-repeat photolithography unit with demagnification. In this case, the pattern on the substrate can be accurately exposed to the interference fringes, and a pattern drawn on the reticle can be accurately projected onto the substrate. Moreover, a lithography system may be configured so that any lithography mode can be selected from among three lithography modes of two-beam interference lithography, step-and-repeat photolithography with demagnification, and two-beam interference lithography and step-and-repeat photolithography with demagnification. In this case, diverse kinds of lithography can be carried out by a single system. Otherwise, another configuration may be such that: for example, a coarse pattern of circuits can be projected by a step-and-repeat photolithography unit with demagnification; a fine pattern of lines and spaces can be transferred by a two-beam interference lithography unit; and a fine pattern of lines and spaces can be formed only in a required region according to a multi-lithography mode composed of the step-and-repeat photolithography with demagnification and two-beam interference lithography. Moreover, light sources included in an interference fringes producing means and the step-and-repeat photolithography unit with demagnification may be designed to offer the same wavelength. In this case, consideration need not be taken into the chromatic dispersion of the sensitivity of a photosensitive member on a substrate to be exposed. This is more preferable.

If the lithography system is used to manufacture devices, a compact device having more microscopic and precise circuits integrated at a higher density can be produced.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A lithography system for exposing a photosensitive member, said system comprising:
    a photosensitive member placement unit; and
    an interference optical system producing interference fringes on the photosensitive member so that the interference fringes will be transferred to the photosensitive member, wherein the interference fringes are aligned based on detected light having passed through said interference optical system.

2. A lithography system according to claim 1, further comprising a diffraction grating, wherein the interference fringes are aligned based on phase information of interference light composed of diffracted light beams produced by said diffraction grating, to which the light having passed through said interference optical system is irradiated.

3. A lithography system according to claim 2, further comprising a stage for controlling the position of the photosensitive member, and alignment means for aligning the photosensitive member on said stage, wherein said diffraction grating is placed on said stage.

4. A lithography system according to claim 1, further comprising a step-and-repeat photolithography unit with demagnification installed adjacent to said interference optical system.

5. A lithography system for exposing a substrate to interference fringes, said system comprising:
    interference fringes producing means;
    interference fringes control means for controlling the interference fringes produced by said interference fringes producing means;
    position-of-interference fringes detecting means for detecting positional information of the interference fringes;
    position-of-substrate detecting means for detecting positional information of the substrate; and
    a substrate stage, wherein (i) the interference fringes are positioned by said interference fringes control means, based on the positional information of the interference fringes, which is detected by said position-of-interference fringes detecting means, (ii) the substrate is positioned based on the positional information of the substrate detected by said position-of-substrate detecting means, and (iii) the interference fringes are thus positioned in a predetermined place on the substrate.

6. A lithography system according to claim 5, wherein said interference fringes producing means comprises at least a coherent light source, separating means for separating light emitted from said coherent light source, and reflecting means for reflecting the separated light and causing the reflected light to fall on the substrate at a predetermined angle of incidence.

7. A lithography system according to claim 6, wherein said interference fringes control means comprises means for detecting the position of said reflecting means and driving means for displacing said reflecting means.

8. A lithography system according to claim 5, further comprising a reference mark base, having a diffraction grating formed thereon, placed on said substrate stage, wherein said the position-of-interference fringes detecting means detects phase information of interference light beams produced by the diffraction grating.

9. A lithography system according to claim 8, wherein said position-of-interference fringes detecting means comprises a coherent light source, a frequency modulator, light-receiving means, and a phase difference meter, and wherein after light emanating from said coherent light source is frequency-modulated by said frequency modulator, the light is caused to be incident on said reflecting means and then be incident on a diffraction grating on said reference mark base at a predetermined angle, diffracted light beams produced by the diffraction grating are received by said light-receiving means, and phase differences between the outputs of said light-receiving means and a reference signal are detected by said phase difference meter.

10. A lithography system according to claim 9, wherein after marks of a diffraction grating are positioned in a plurality of places within the area of interference fringes produced by said interference fringes producing means with interferometers incorporated in said substrate stage as references, diffracted light beams produced by the diffraction grating are received in the places by said position-of-interference fringes detecting means, relative positional deviations of the interference fringes from the diffraction grating which are detected in the respective places are calculated, and a positional deviation of the interference fringes from the axes of said substrate stage is calculated based on the plurality of positional deviations in terms of three parameters, a shift in a direction in which the interference fringes are arranged, a magnitude of rotation, and a magnification for the interference fringes.

11. A lithography system according to claim 8, wherein said position-of-substrate detecting means creates detectable marks on or near a diffraction grating on said reference mark base, which are detected by said position-of-substrate detecting means in order to correct a shift of said position-of-substrate detecting means with respect to interference fringes produced by said interference fringes producing means.

12. A lithography system according to claim 5, wherein said position-of-substrate detecting means detects positions of alignment marks on the substrate, and an error in patterning circuits at a plurality of locations on the substrate with respect to the axes of said substrate stage is calculated in terms of six parameters, a shift error in the X-axis direction, a shift error in the Y-axis direction, a magnification error in the X-axis direction, a magnification error in the Y-axis direction, a rotational error about the X axis, and a rotational error about the Y axis.

13. A lithography system according to claim 5, wherein said position-of-interference fringes detecting means detects a positional deviation of interference fringes produced by said interference fringes producing means from the axes of said substrate stage in terms of three parameters, a shift in a direction in which the interference fringes are arranged, a magnitude of rotation, and a magnification for the interference fringes, and wherein said position-of-substrate detecting means detects an error in patterning circuits at a plurality of locations on the substrate with respect to the axes of said substrate stage in terms of six parameters, a shift error (Swx) in the X-axis direction, a shift error (Swy) in the Y-axis direction, a magnification error ($\beta$x) in the X-axis direction, a magnification error ($\beta$y) in the Y-axis direction, a rotational error (Rx) about the X axis, and a rotational error (Ry) about the Y axis, the interference fringes are rotated by (Rx−$\omega$z); the magnification for the interference fringes is corrected by ($\beta$x−$\beta$), the position of the interference fringes is corrected by (−Sx); the pattern of circuits on the substrate is aligned with the interference fringes using the six parameters (Swx, Swy, $\beta$x, $\beta$y, Rx, and Ry), and the pattern of circuits on the substrate is exposed to the interference fringes.

14. A lithography system according to claim 5, wherein said position-of-interference fringes detecting means detects a positional deviation of interference fringes produced by said interference fringes producing means from the axes of said substrate stage in terms of three parameters, a shift (Sx) in a direction in which the interference fringes are arranged, a magnitude of rotation ($\omega$z), and a magnification for the interference fringes ($\beta$), and wherein said position-of-substrate detecting means detects an error in patterning circuits at a plurality of locations on the substrate with respect to the axes of said substrate stage in terms of six parameters, a shift error in the X-axis direction (Swx), a shift error in the Y-axis direction (Swy), a magnification error in the X-axis direction ($\beta$x), a magnification error in the Y-axis direction ($\beta$y), a rotational error about the X axis (Rx), and a rotational error about the Y axis (Ry), the magnification for the interference fringes is corrected by ($\beta$x−$\beta$), the pattern of circuits on the substrate is aligned with the interference fringes using the six parameters (Swx, Swy, $\beta$x, $\beta$y, Rx, and Ry), a shift of the interference fringes (Sx), and a magnitude of rotation ($\omega$z), and the pattern of circuits on the substrate is exposed to the interference fringes.

15. A lithography system for projecting a pattern drawn on a reticle onto a substrate, said system comprising:
   interference fringes producing means;
   interference fringes control means for controlling interference fringes produced by said interference fringes producing means;
   position-of-interference fringes detecting means for detecting positional information of the interference fringes;
   position-of-substrate detecting means for detecting positional information of the substrate;
   reticle holding means for holding a reticle;
   reticle alignment means;
   a step-and-repeat photolithography unit with demagnification;
   illuminating means for illuminating the reticle held by said reticle holding means so that a pattern drawn on the reticle will be demagnified and projected onto the substrate by said step-and-repeat photolithography unit with demagnification; and a substrate stage for holding the substrate, wherein (i) the interference fringes are positioned by said interference fringes control means, based on positional information of the interference fringes, which is detected by said position-of-interference fringes detecting means, and said reticle alignment means aligns the reticle with said step-and-repeat photolithography unit with demagnification, and (ii) the substrate is positioned relative to the interference fringes according to positional information of the substrate detected by said position-of-substrate detecting means, and exposed to the interference fringes, the substrate is positioned in said step-and-repeat photolithography unit with demagnification according to positional information of the substrate detected by said position-of-substrate detecting means, and then a pattern drawn on the reticle is projected onto the substrate.

16. A lithography system according to claim 15, further comprising a facility enabling selection of any lithography mode selected from among three lithography modes of two-beam interference lithography, step-and-repeat photolithography with demagnification, and multi-lithography composed of two-beam interference lithography and step-and-repeat photolithography with demagnification.

17. A lithography system according to claim 15, further comprising light sources used for exposure by said interference fringes producing means and said step-and-repeat photolithography unit with demagnification, wherein light sources produce the same wavelength.

18. A method of manufacturing devices, comprising the steps of:

aligning interference fringes according to detected light that has passed through an interference fringes production interference optical system;

producing interference fringes on a photosensitive member using the interference optical system so that the interference fringes will be transferred to the photosensitive member; and forming circuits according to a pattern drawn on the photosensitive member by transferring the interference fringes.

19. A method of manufacturing devices, comprising the steps of:

exposing a substrate using a lithography system, the lithography system comprising interference fringes producing means, interference fringes control means for controlling interference fringes produced by the interference fringes producing means, position-of-interference fringes detecting means for detecting positional information of the interference fringes, position-of-substrate detecting means for detecting positional information of a substrate, and a substrate stage for holding a substrate;

positioning the interference fringes by the interference fringes control means, based on positional information of the interference fringes, which is detected by the position-of-interference fringes detecting means;

positioning the substrate based on positional information of the substrate detected by the position-of-substrate detecting means;

thereafter, positioning the interference fringes in a predetermined place on the substrate; and forming circuits according to a pattern drawn on the substrate by exposing the substrate, to manufacture devices.

20. A method of manufacturing devices, comprising the steps of:

exposing a substrate using a lithography system, the lithography system comprising interference fringes producing means, interference fringes control means for controlling interference fringes produced by the interference fringes producing means, position-of-interference fringes detecting means for detecting positional information of the interference fringes, position-of-substrate detecting means for detecting positional information of the substrate, reticle holding means for holding a reticle, reticle alignment means, a step-and-repeat photolithography unit with demagnification, illuminating means for illuminating a reticle held by the reticle holding means so that a pattern drawn on the reticle will be demagnified and projected onto the substrate by the step-and-repeat photolithography unit with demagnification, and a substrate stage for holding a substrate;

positioning the interference fringes by the interference fringes control means, based on positional information of the interference fringes, which is detected by the position-of-interference fringes detecting means;

aligning the reticle with the step-and-repeat photolithography unit with demagnification by the reticle alignment means;

positioning the substrate relative to the interference fringes according to positional information of the substrate detected by the position-of-substrate detecting means, and exposed to the interference fringes;

positioning the substrate in the step-and-repeat photolithography unit with demagnification according to positional information of the substrate detected by the position-of-substrate detecting means;

thereafter, projecting a pattern drawn on the reticle onto the substrate, and forming circuits according to the pattern drawn on the substrate by exposing the substrate, to manufacture a device.

* * * * *

UNITED STATES PATENT AND TRADEMARK OFFICE
CERTIFICATE OF CORRECTION

PATENT NO.   : 6,304,318 B1                                                              Page 1 of 1
DATED        : October 16, 2001
INVENTOR(S)  : Takahiro Matsumoto It is certified that error appears in the above-identified patent and that said Letters Patent is hereby corrected as shown below:

Column 3,
Line 8, "includes" should read -- including --.

Column 10,
Line 25, "+ch1" should read -- φ1 --.
Line 29, "+ch1" should read -- φ1 --.
Line 60, "oy" should read -- ωy --.

Signed and Sealed this

Ninth Day of April, 2002

Attest:

JAMES E. ROGAN
Attesting Officer       Director of the United States Patent and Trademark Office